(12) United States Patent
Fu et al.

(10) Patent No.: US 11,728,218 B2
(45) Date of Patent: Aug. 15, 2023

(54) SEMICONDUCTOR DEVICE AND METHOD

(71) Applicant: Taiwan Semiconductor Manufacturing Co., Ltd., Hsinchu (TW)

(72) Inventors: Ching-Feng Fu, Taichung (TW); Yu-Lien Huang, Jhubei (TW); Tsai-Jung Ho, Xihu Township (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 123 days.

(21) Appl. No.: 17/232,374

(22) Filed: Apr. 16, 2021

(65) Prior Publication Data

US 2022/0336288 A1    Oct. 20, 2022

(51) Int. Cl.
*H01L 21/8234* (2006.01)
*H01L 29/66* (2006.01)
*H01L 27/092* (2006.01)

(52) U.S. Cl.
CPC ........ *H01L 21/823431* (2013.01); *H01L 21/823418* (2013.01); *H01L 27/0924* (2013.01); *H01L 29/66795* (2013.01)

(58) Field of Classification Search
CPC ........... H01L 21/0337; H01L 21/31144; H01L 21/32; H01L 21/32139; H01L 21/823418; H01L 21/823481; H01L 21/823431; H01L 29/0847; H01L 27/0924
See application file for complete search history.

(56) References Cited

U.S. PATENT DOCUMENTS

| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2017/0047253 | A1* | 2/2017 | Park ................ H01L 21/31105 |
| 2019/0109205 | A1* | 4/2019 | Yatsuda ............ H01L 21/3086 |
| 2020/0043945 | A1* | 2/2020 | Kim ............... H01L 21/823878 |
| 2020/0075421 | A1* | 3/2020 | Wu .................... H01L 23/485 |
| 2021/0183696 | A1 | 6/2021 | Chen et al. |

FOREIGN PATENT DOCUMENTS

TW    202036687 A    10/2020

* cited by examiner

*Primary Examiner* — Tuan A Hoang
(74) *Attorney, Agent, or Firm* — Slater Matsil, LLP

(57) ABSTRACT

A method includes forming a first inter-layer dielectric (ILD) layer over source and drain regions of a semiconductor structure; forming a first mask material over the first ILD layer; etching first openings in the first mask material; filling the first openings with a fill material; etching second openings in the fill material; filling the second openings with a second mask material; removing the fill material; and etching the first ILD layer using the first mask material and the second mask material as an etching mask to form openings in the first ILD layer that expose portions of the source and drain regions of the semiconductor structure.

20 Claims, 19 Drawing Sheets

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
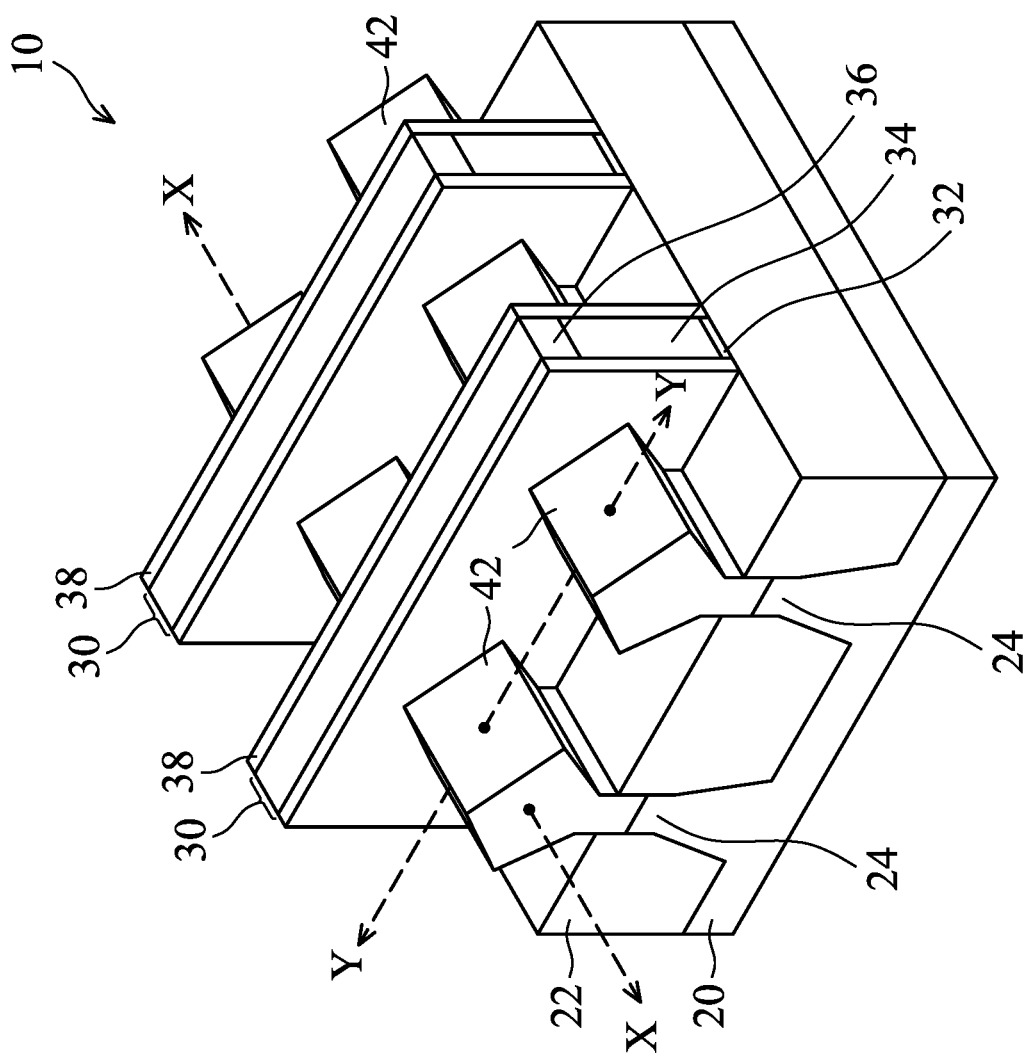
FIGS. 1 and 2 illustrate perspective views of intermediate stages in the formation of a Fin Field-Effect Transistors (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming the same are provided in accordance with various embodiments. In particular, source/drain contacts of FinFET devices are formed. The openings for the source/drain contacts may be formed, for example, by forming a hard mask over an inter-layer dielectric (ILD). Openings are etched in the hard mask that correspond to the larger region within which the source/drain contacts are formed. The openings in the hard mask are filled with a sacrificial material. The sacrificial material is then patterned, the pattern corresponding to subsequently formed cuts between the source/drain contacts. The pattern in the sacrificial material is filled with a cut mask material to form a patterned cut mask. The openings for the source/drain contacts are then etched using the hard mask and the patterned cut mask as an etching mask. In some cases, the use of a sacrificial material to form a patterned cut mask can allow for smaller cuts (e.g., cuts having a smaller width or finer pitch) between the source/drain contacts. Additionally, the use of the patterned cut mask can form contact openings having a smaller width near the bottom, which allows for improved filling to form the source/drain contacts.

Throughout the various views and illustrative embodiments, like reference numbers are used to designate like elements. In some illustrated embodiments, the formation of Fin Field-Effect Transistors (FinFETs) is used as an example to explain the concept of the present disclosure. The illustrated FinFETs may be electrically coupled in a manner to operate as, for example, one transistor or multiple transistors, such as two or more transistors. Other types of transistors such as planar transistors, Gate-All-Around (GAA) transistors, or the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order. Some embodiments discussed herein are discussed in the context of FinFETs formed using a gate-last process. In other embodiments, a gate-first process may be used. Also, some embodiments contemplate aspects used in planar devices, such as planar FETs.

FIG. 1 illustrates a perspective view of an intermediate step in the formation of a FinFET structure, in accordance with some embodiments. The structure includes a wafer 10, which further includes a substrate 20. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In FIG. 1, fins 24 are shown formed in the substrate 20. The fins 24 are semiconductor strips, and may also be referred to as "semiconductor fins 24," "semiconductor strips 24," or "strips 24." In accordance with some embodiments of the present disclosure, the fins 24 are parts of the original the substrate 20, and hence the material of the fins 24 is the same as that of the substrate 20. In some embodiments, the fins 24 are formed by etching the portions of the substrate 20 to form recesses. The etching may be any acceptable etch process, such as a reactive ion etch (RIE), neutral beam etch (NBE), the like, or a combination thereof. The etch may be anisotropic. The fins 24 may be patterned by any suitable method. For example, the fins 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 24. In some embodiments, the mask (or other layer) may remain on the fins 24.

In some embodiments, the fins 24 may be formed by an epitaxial growth process. For example, a dielectric layer can be formed over a top surface of the substrate 20, and trenches can be etched through the dielectric layer to expose the underlying substrate 20. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 24. For example, the fins 24 in FIG. 1 can be recessed, and a material different from the fins 24 may be epitaxially grown over the recessed fins 24. In such embodiments, the fins 24 comprise the recessed material as well as the epitaxially grown material disposed over the recessed material. Accordingly, the fins 24 may be formed of a semiconductor material different from that of the substrate 20. In accordance with some embodiments, the fins 24 are formed of silicon; germanium; a compound semiconductor including silicon phosphide, silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In an even further embodiment, a dielectric layer can be formed over a top surface of the substrate 20, and trenches can be etched through the dielectric layer. Heteroepitaxial structures can then be epitaxially grown in the trenches using a material different from the substrate 20, and the dielectric layer can be recessed such that the heteroepitaxial structures protrude from the dielectric layer to form the fins 24. In some embodiments where homoepitaxial or heteroepitaxial structures are epitaxially grown, the epitaxially grown materials may be in situ doped during growth, which may obviate prior and subsequent implantations although in situ and implantation doping may be used together.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

As shown in FIG. 1, Shallow Trench Isolation (STI) regions 22 may be formed between the fins 24. The STI regions 22 may comprise a material such as an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other materials formed by any acceptable process may be used. An anneal process may be performed once the material is formed. Although the STI regions 22 are illustrated as a single layer, some embodiments may utilize multiple layers. For example, in some embodiments a liner (not shown) may first be formed along surfaces of the substrate 20 and the fins 24. Thereafter, a fill material, such as those discussed above, may be formed over the liner.

After forming the material of the STI regions 22, a planarization process may be performed to remove material of the STI regions 22 and expose the fins 24. The planarization process may be, for example, a chemical mechanical polish (CMP), an etch-back process, combinations thereof, or the like. The planarization process may expose the fins 24 such that top surfaces of the fins 24 and the STI regions 22 are level after the planarization process is complete. In embodiments in which a mask remains on the fins 24, the planarization process may expose the mask or remove the mask such that top surfaces of the mask or the fins 24, respectively, and the STI regions 22 are level after the planarization process is complete.

The STI regions 22 may be recessed such that top portions of the fins 24 protrude higher than the remaining portions of STI regions 22. The top surfaces of the STI regions 22 may have a flat surface as illustrated, a convex surface, a concave surface (such as dishing), or a combination thereof. The STI regions 22 may be recessed using an acceptable etching process, such as one that is selective to the material of the STI regions 22 (e.g., etches the material of the STI regions 22 at a faster rate than the material of the fins 24). The etching may be performed, for example, using a dry etching process, such as a process in which wherein $NF_3$ and $NH_3$ are used as the etching gases. In accordance with alternative embodiments of the present disclosure, the recessing of the STI regions 22 is performed using a wet etch process. For example, an oxide removal using dilute hydrofluoric (dHF) acid may be used.

Further referring to FIG. 1, dummy gate stacks 30 are formed on the top surfaces and the sidewalls of the fins 24. Each dummy gate stack 30 may include a dummy gate dielectric 32 and a dummy gate electrode 34 formed over the dummy gate dielectric 32. Each of the dummy gate stacks 30 may also include a mask layer 36 over the dummy gate electrode 34. The mask layer 36 may comprise one or more layers. Dummy gate stacks 30 may cross over a single one or a plurality of the fins 24 and/or STI regions 22. Dummy gate stacks 30 also have lengthwise directions perpendicular to the lengthwise directions of the fins 24.

The dummy gate dielectric 32 may comprise, for example, silicon oxide, silicon nitride, a combination thereof, or the like, and may be deposited or thermally grown according to acceptable techniques. The dummy gate electrode 34 may be deposited over the dummy gate dielectric 32 and then planarized, such as by a CMP. The mask layer 36 may be deposited over the dummy gate electrodes 34. The dummy gate electrode 34 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gate electrode 34 may be deposited by physical vapor deposition (PVD), CVD, sputter deposition, or other techniques known and used in the art for depositing the selected material. The dummy gate electrode 34 may be made of other materials that have a high etching selectivity from the etching of isolation regions. The mask layer 36 may include, for example, silicon nitride, silicon oxynitride, silicon carbonitride, the like, or combinations thereof. It is noted that the dummy gate dielectric 32 is shown covering the fins 24 and the STI regions 22, but in other embodiments, the dummy gate dielectric 32 may deposited such that the dummy gate dielectric 32 does not extend on surfaces of the STI regions 22.

Next, gate spacers 38 are formed on the sidewalls of the dummy gate stacks 30. In some embodiments, a thermal oxidation or a deposition followed by an anisotropic etch may form the gate spacers 38. In accordance with some embodiments of the present disclosure, the gate spacers 38 are formed of a dielectric material such as silicon nitride, silicon oxide, silicon carbonitride, silicon oxynitride, silicon oxycarbonitride, or the like, and may be a single-layer structure or a multi-layer structure including multiple dielectric layers. After the formation of the gate spacers 38, implants for lightly doped source/drain (LDD) regions (not explicitly illustrated) may be performed. In some embodiments, one or more layers of the gate spacers 38 are formed after implantation of the LDD regions.

Still referring to FIG. 1, epitaxial source/drain regions 42 are formed in the fins 24, in accordance with some embodiments. An etching step (referred to as source/drain recessing hereinafter) may be performed to etch the portions of the fins 24 that are not covered by the dummy gate stack 30 and the gate spacers 38. The recessing may be anisotropic etching process that does not etch the portions of the fins 24 directly underlying the dummy gate stacks 30 and the gate spacers 38. The top surfaces of the recessed fins 24 may be lower than the top surfaces of the STI regions 22, as shown in FIG. 1. For example, the fins 24 may be etched using a selective etch such as $NF_3$ and $NH_3$, HF and $NH_3$, or the like. In other embodiments, the fins 24 are not recessed prior to formation of the epitaxial source/drain regions 42.

Epitaxial source/drain regions 42 are then formed on the recessed portions of the fins 24, in accordance with some embodiments. The epitaxial source/drain regions 42 may be formed, for example, by selectively growing semiconductor material(s) from the recessed portions of the fins 24, resulting in the structure shown in FIG. 1. In accordance with some embodiments, the epitaxial source/drain regions 42 include silicon germanium, silicon, silicon carbon, germanium, the like, or combinations thereof. Depending on whether the resulting FinFET is a p-type FinFET or an n-type FinFET, a p-type or an n-type impurity may be in-situ doped during the epitaxial growth process. For example, when the resulting FinFET is a p-type FinFET, silicon germanium, germanium, germanium tin, boron-doped silicon germanium (SiGeB), boron-doped germanium, the like, or combinations thereof may be grown. When the resulting FinFET is an n-type FinFET, silicon phosphide (SiP), silicon carbide (SiC), phosphorous-doped silicon carbide (SiCP), or the like, may be grown. In accordance with alternative embodiments of the present disclosure, epitaxial source/drain regions 42 are formed of a III-V compound semiconductor such as GaAs, InP, GaN, InGaAs, InAlAs, GaSb, AlSb, AlAs, AlP, GaP, combinations thereof, or multi-layers thereof. The epitaxial source/drain regions 42 may also have surfaces raised from respective surfaces of the fins 24 and may have facets. Subsequent figures illustrate structures formed from the structure shown in FIG. 1, but the embodiments and techniques described herein may be used with the structure shown in FIG. 1 or other structures, embodiments, or devices.

FIG. 1 further illustrates several reference cross-sections. Cross-section X-X and is along a longitudinal axis of a fin 24 and in a direction of, for example, a current flow between the source/drain regions 42 of a FinFET. Cross-section Y-Y is perpendicular to cross-section X-X and extends through the source/drain regions 42 of the FinFETs. Subsequent figures refer to these reference cross-sections for clarity.

Figure 2:
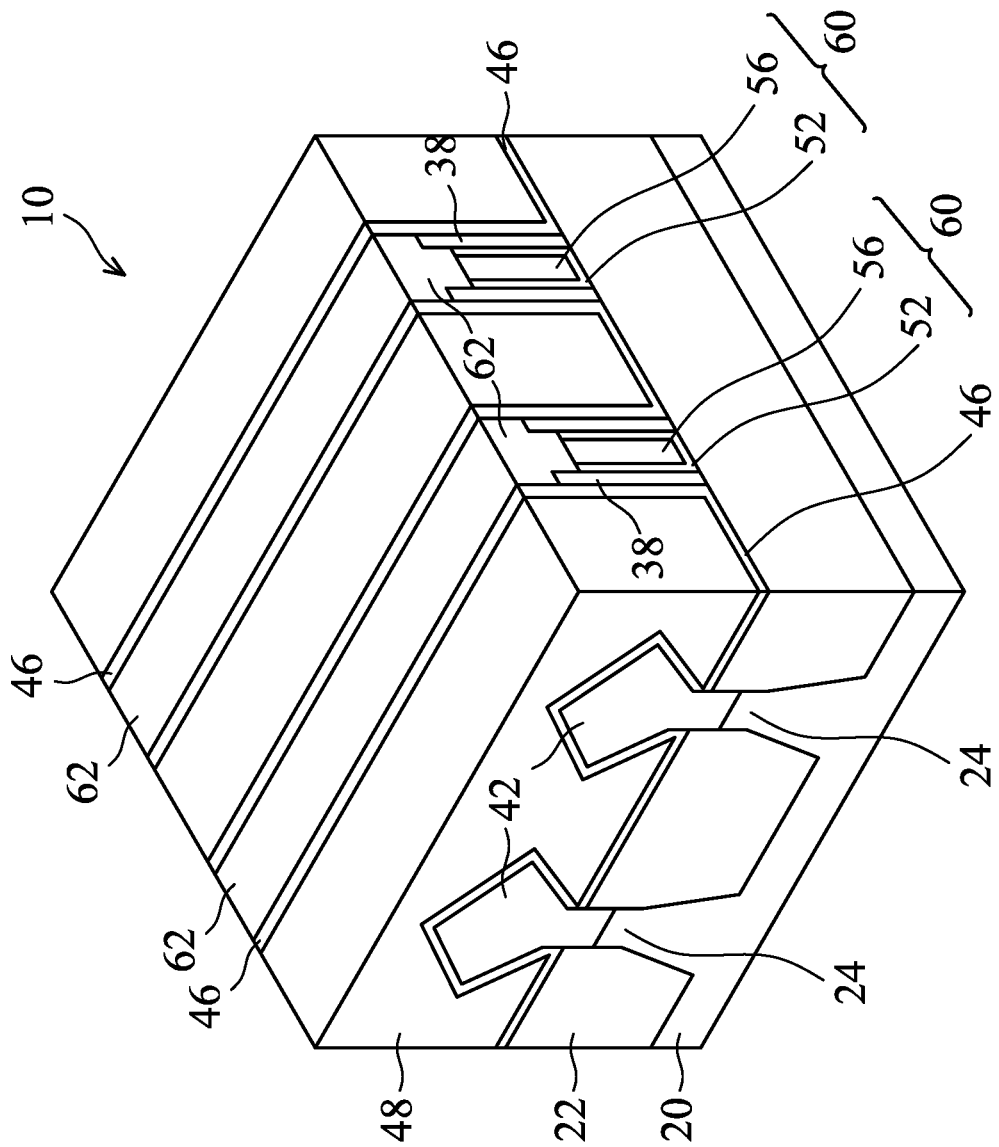

Turning to FIG. 2, a first interlayer dielectric (ILD) 48 is deposited over the structure illustrated in FIG. 1. The first ILD 48 may be formed of a dielectric material, and may be deposited by any suitable method, such as CVD, plasma-enhanced CVD (PECVD), or flowable CVD (FCVD). Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 46 is disposed between the first ILD 48 and the epitaxial source/drain regions 42 and the gate spacers 38. The CESL 46 may comprise a dielectric material, such as silicon nitride, silicon oxide, silicon oxynitride, silicon carbonitride, or the like, having a different etch rate than the material of the overlying first ILD 48. A planarization process such as a CMP process or a mechanical grinding process may be performed to level the top surfaces of the first ILD 48. The first ILD 48 may have a thickness T1 (see FIG. 3) between about 50 nm and about 80 nm, in some embodiments. Other thicknesses are possible.

The dummy gate dielectric 32, the dummy gate electrode 34, and the mask layer 36 are removed and a replacement gate stack 60 is formed, in accordance with some embodiments. In some embodiments, the dummy gate dielectric 32, the dummy gate electrode 34, and the mask layer 36 may be removed using an anisotropic dry etch process. For example, the etching process may include a dry etch process using reaction gas(es) that selectively etches the dummy gate dielectric 32, the dummy gate electrode 34, and the mask layer 36 without etching the first ILD 48 or the gate spacers 38. In some embodiments, a wet etch process or an oxide removal process may be used. In some embodiments, the dummy gate dielectric 32 is removed in a first region of a die (e.g., a core logic region) and remains in a second region of the die (e.g., an input/output region). The removal of the dummy gate dielectric 32 and the dummy gate electrode 34 forms a recess that exposes a channel region of a respective fin 24. During the removal, the dummy gate dielectric 32 may be used as an etch stop layer when the dummy gate electrodes 34 are etched. The dummy gate dielectric 32 may then optionally be removed after the removal of the dummy gate electrodes 34.

The replacement gate stack 60 includes a gate dielectric layer 52 and a gate electrode 56, in accordance with some embodiments. Gate dielectric layers 52 are deposited conformally in the recesses, such as on the top surfaces and the sidewalls of the fins 24 and on sidewalls of the gate spacers 38. The gate dielectric layers 52 may also be formed on the top surface of the first ILD 48. In accordance with some embodiments, the gate dielectric layers 52 comprise silicon oxide, silicon nitride, or multilayers thereof. In some embodiments, the gate dielectric layers 52 include a high-k dielectric material, and in these embodiments, the gate dielectric layers 52 may have a k value greater than about 7.0, and may include a metal oxide or a silicate of hafnium, aluminum, zirconium, lanthanum, manganese, barium, titanium, lead, and combinations thereof. The formation methods of the gate dielectric layers 52 may include molecular-beam deposition (MBD), atomic layer deposition (ALD), PECVD, the like, or combinations thereof. In embodiments where portions of the dummy gate dielectric 32 remains in the recesses, the gate dielectric layers 52 include a material of the dummy gate dielectric 32 (e.g., $SiO_2$).

The gate electrodes 56 are deposited over the gate dielectric layers 52, respectively, and fill the remaining portions of the recesses. The gate electrodes 56 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 56 is illustrated in FIG. 2, the gate electrode 56 may comprise any number of liner layers, any number of work function tuning layers, and a fill material. A planarization process, such as a CMP, may be performed to remove the excess portions of the gate dielectric layers 52 and the material of the gate electrodes 56, which excess portions are over the top surface of the ILD 48. The remaining portions of material of the gate electrodes 56 and the gate dielectric layers 52 thus form replacement gates 60 of the resulting FinFETs. The gate electrodes 56 and the gate dielectric layers 52 may be collectively referred to as a "replacement gate stack 60," a "gate stack 60," or a "gate structure 60." The replacement gate stacks 60 may extend along sidewalls of a channel region of the fins 24.

The formation of the gate dielectric layers 52 in different regions of the wafer 10 may occur simultaneously such that the gate dielectric layers 52 in each region are formed from the same materials, and the formation of the gate electrodes 56 may occur simultaneously such that the gate electrodes 56 in each region are formed from the same materials. In some embodiments, the gate dielectric layers 52 in each region may be formed by distinct processes, such that the gate dielectric layers 52 may be different materials, and/or the gate electrodes 56 in each region may be formed by distinct processes, such that the gate electrodes 56 may be different materials. Various masking steps may be used to mask and expose appropriate regions when using distinct processes.

Still referring to FIG. 2, hard masks 62 may be formed over the gate stacks 60, in accordance with some embodiments. The hard masks 62 may be formed of silicon nitride, silicon oxynitride, silicon oxycarbide, silicon oxycarbonitride, the like, or combinations thereof. The formation of the hard masks 62 may include recessing the gate stacks 60 (including gate dielectric layers 52 and corresponding overlying gate electrodes 56) using one or more etching processes to form recesses, so that a recess is formed directly over the gate stack 60 and between opposing portions of gate spacers 38. As shown in FIG. 2, the gate spacers 38 may also be etched. Then, a dielectric material is filled into the recesses, and planarization process is performed to remove the excess portions of the dielectric material. The remaining portions of the dielectric material form the hard masks 62. In some embodiments, one or more additional dielectric layers may be formed over the recessed gate electrode 56 before forming the hard mask 62, which may, for example, include an etch stop layer.

Figure 16B:
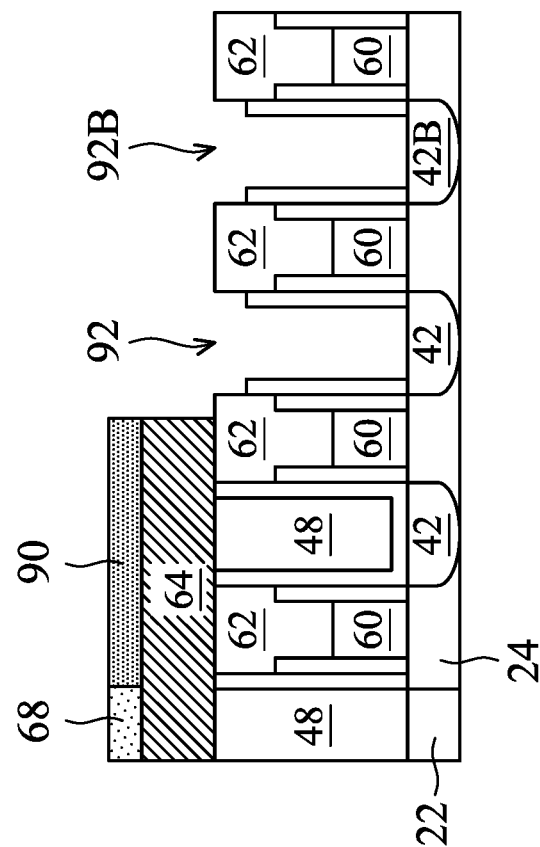
FIGS. 16A, 16B, and 16C illustrate various views of intermediate stages in the formation of openings for source/drain contacts of a FinFET device, in accordance with other embodiments.
Figure 16A:
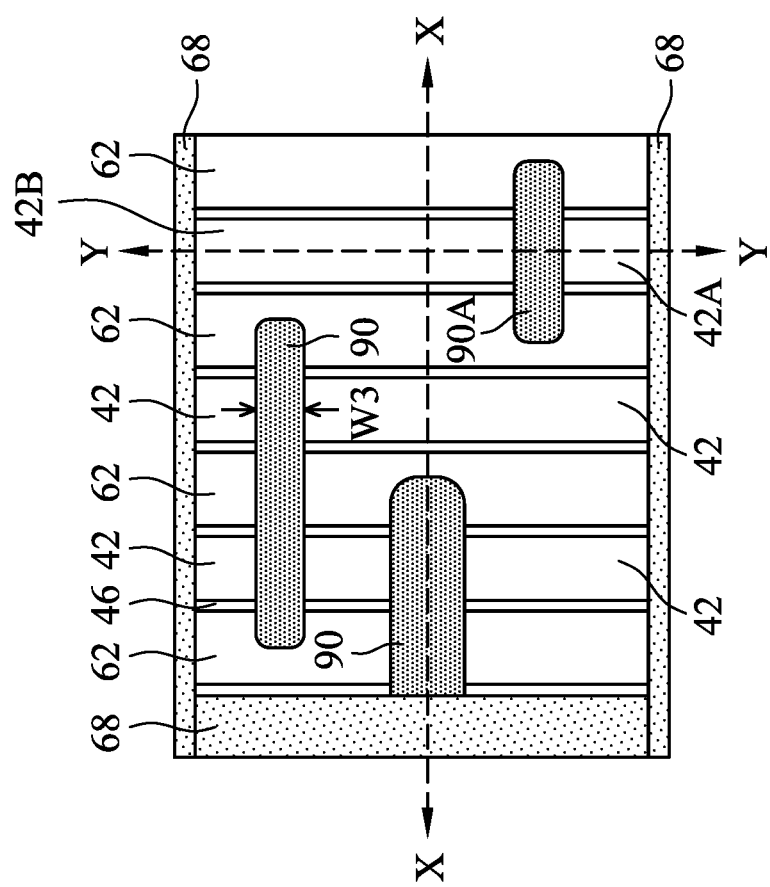
Figure 16C:
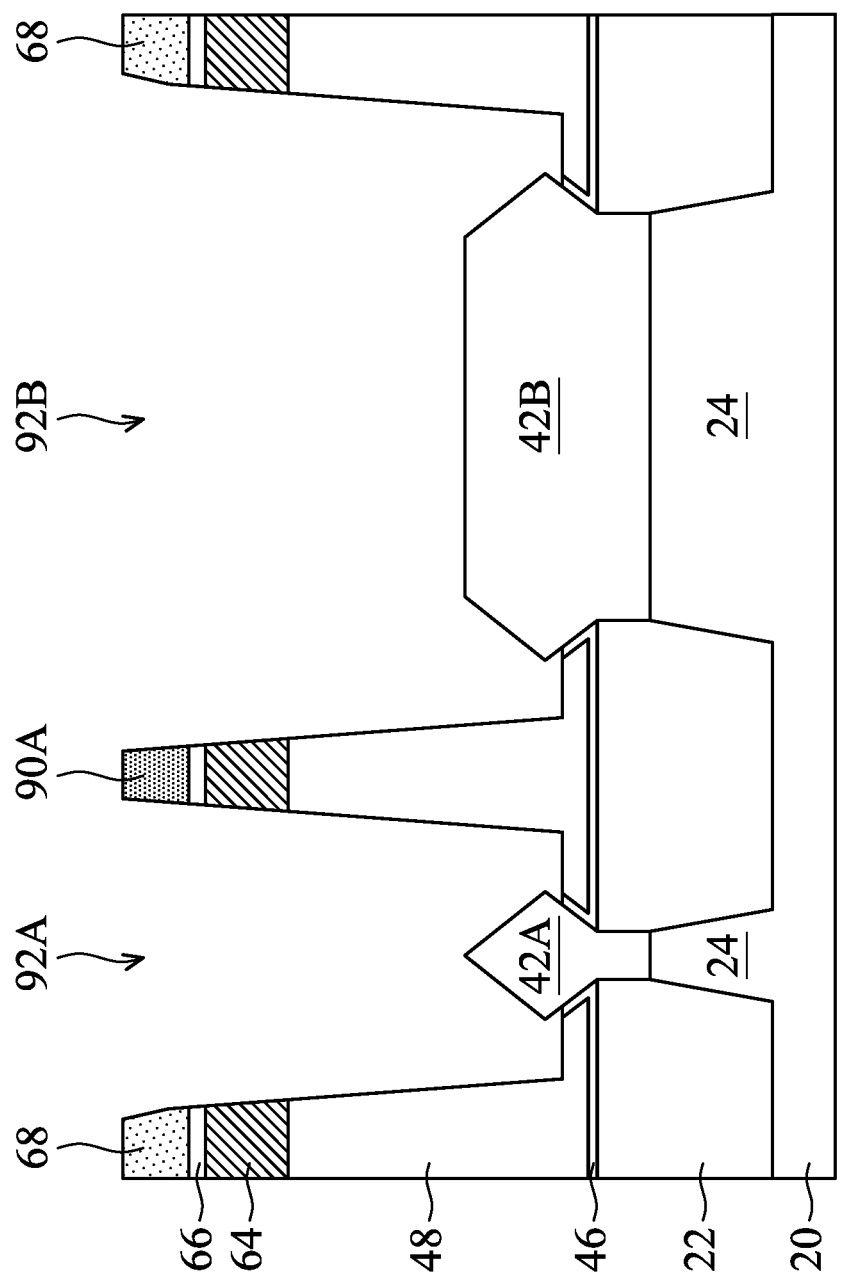
Figure 17B:
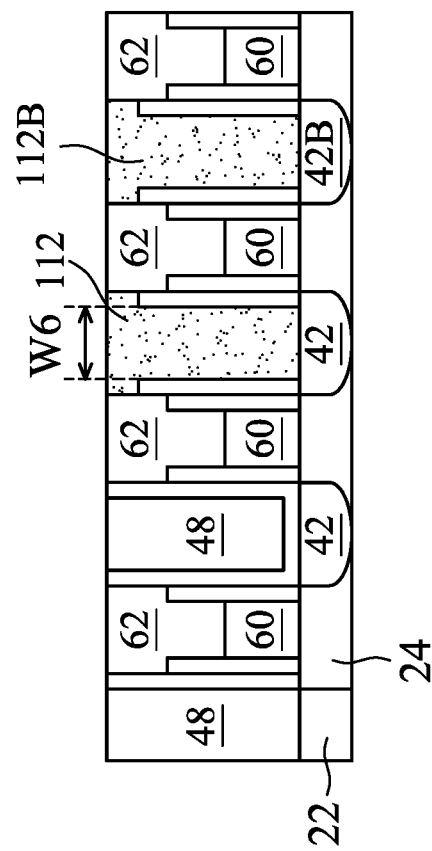
FIGS. 17A, 17B, and 17C illustrate various views of intermediate stages in the formation source/drain contacts of a FinFET device, in accordance with other embodiments.
Figure 17A:
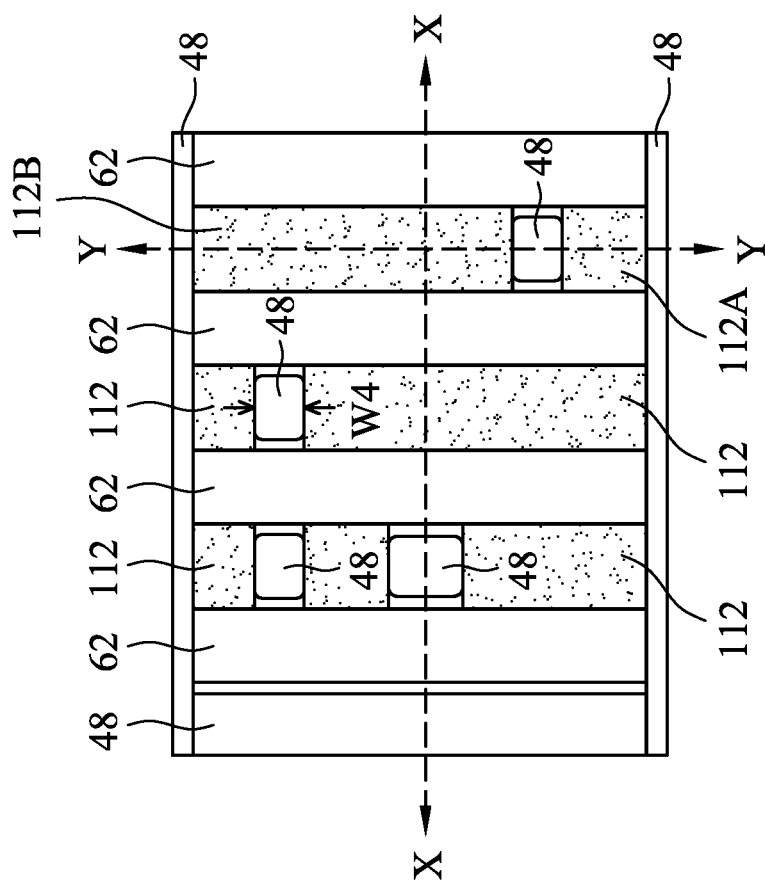
Figure 17C:
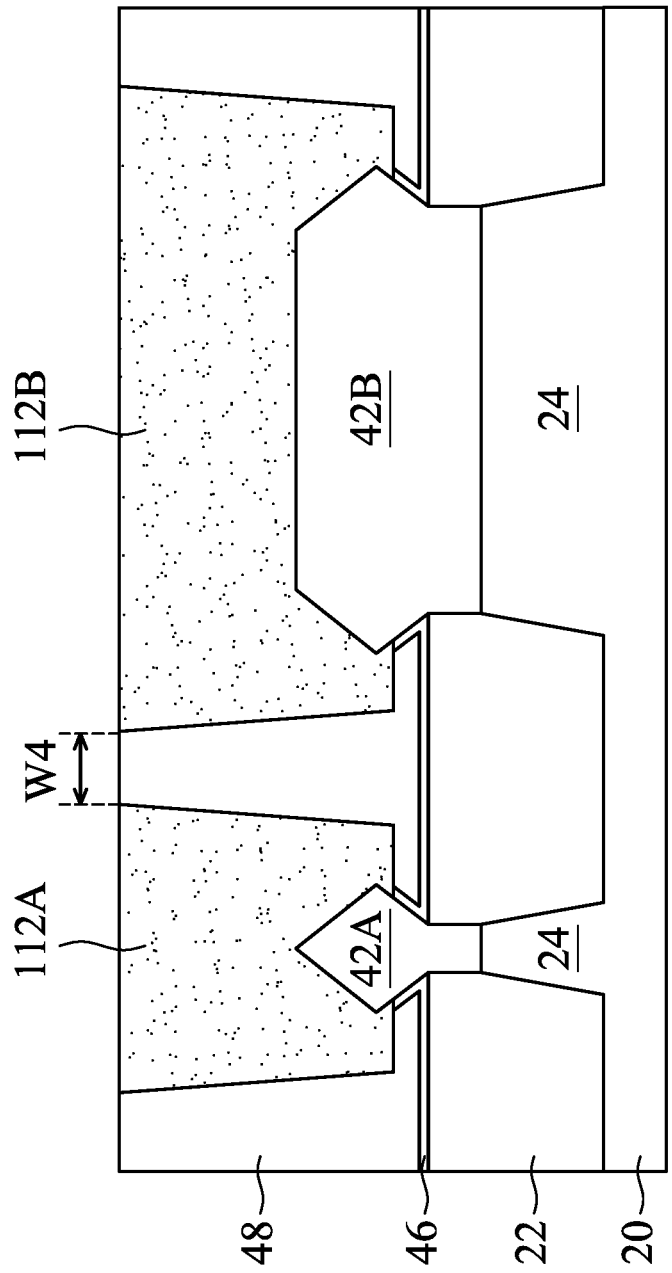

FIGS. 3 through 17C illustrate various views of intermediate steps in the formation of source/drain contacts 112 (see FIGS. 15 and 17A-C), in accordance with some embodiments. FIGS. 15, 16C, and 17C illustrate cross-sectional views analogous to the cross-section Y-Y shown in FIG. 1. FIGS. 16B and 17B illustrate cross-sectional views analogous to the cross-section X-X shown in FIG. 1. FIGS. 16A and 17A illustrate plan views. The various views shown in the figures are illustrative examples, and other configurations or arrangements than shown are considered within the scope of the present disclosure.

Figure 3:
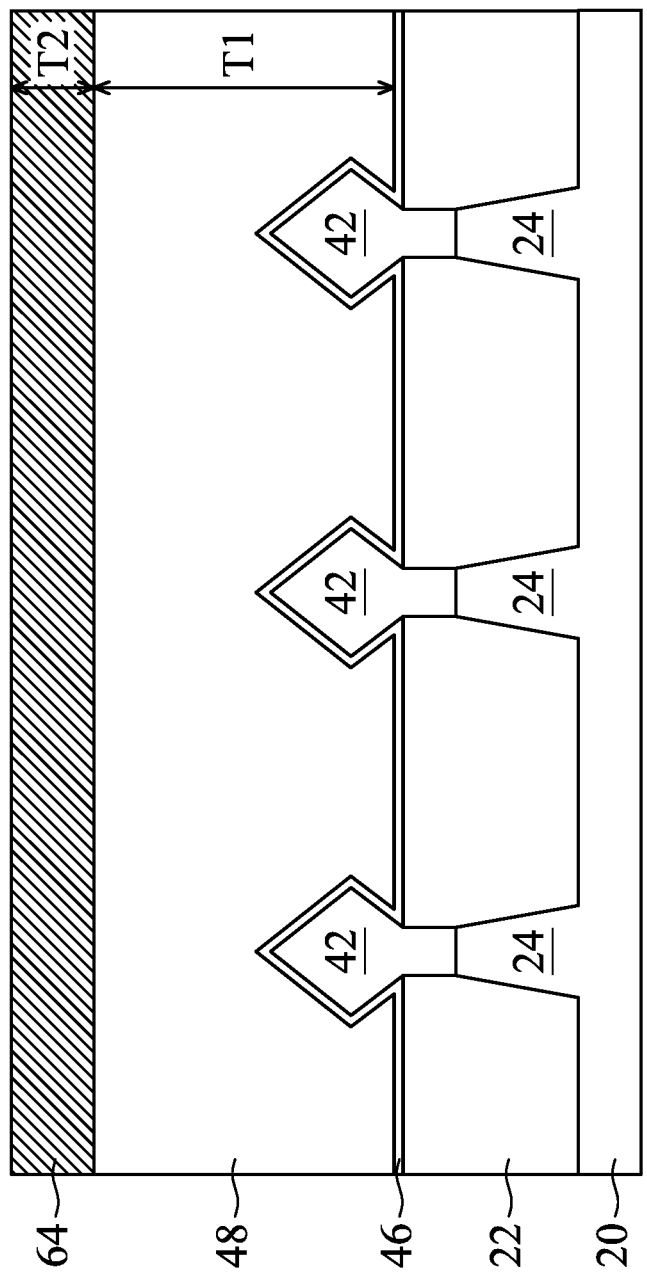
FIGS. 3, 4, 5, 6, 7, 8, 9, 10, 11, 12, 13, 14, and 15 illustrate cross-sectional views of intermediate stages in the formation of source/drain contacts of a FinFET device, in accordance with some embodiments.

In FIG. 3, a second ILD 64 is deposited over the first ILD 48. In some embodiments, the second ILD 64 is a flowable film formed by a flowable CVD method. In some embodiments, the second ILD is formed of a dielectric material such as PSG, BSG, BPSG, USG, or the like, and may be deposited by any suitable method, such as CVD and PECVD. The second ILD 64 may have a thickness T2 between about 10 nm and about 20 nm, in some embodiments. Other thicknesses are possible.

Figure 4:
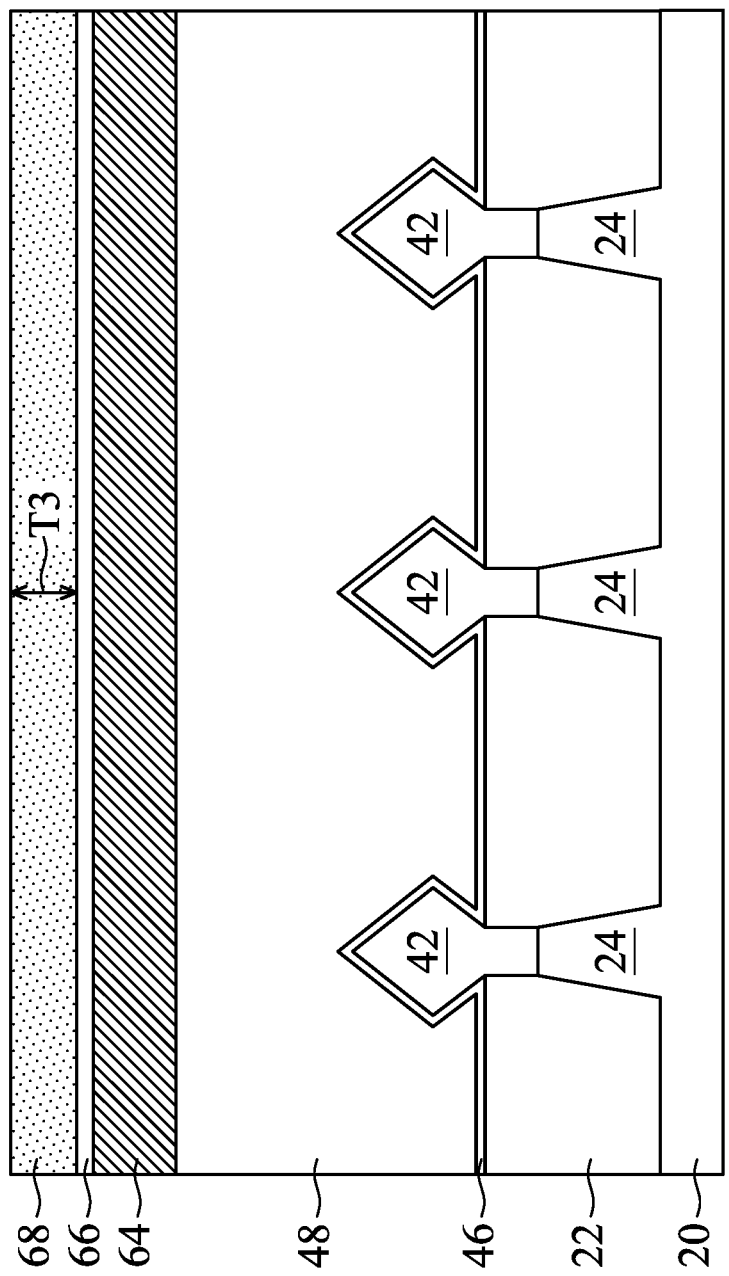

In FIG. 4, an etch stop layer 66 is formed over the first ILD 48. The etch stop layer 66 may comprise a dielectric material, such as silicon nitride, silicon oxynitride, silicon carbide, silicon carbonitride, aluminum oxide, hafnium oxide, the like, or a combination thereof, that may be etched a different etch rate than the material of the first ILD 48 or the overlying fill material 72 (see FIG. 6). In some embodiments, the etch stop layer 66 has a thickness between about 20 Å and about 100 Å. Other thicknesses are possible. The etch stop layer 66 may be formed by a process such as CVD, ALD, or the like. However, any suitable processes and materials may be used. In other embodiments, an etch stop layer 66 is not formed over the first ILD 48.

A hard mask layer 68 may be formed over the etch stop layer 66. In some embodiments, the hard mask layer 68 may be formed of a material that includes a metal (e.g., titanium nitride (TiN), titanium, tantalum nitride, tantalum, a metal-doped carbide (e.g., tungsten carbide (WC)), or the like) and/or a metalloid (e.g., silicon nitride, boron nitride, silicon carbide, or the like). In some embodiments, a material composition of the hard mask layer 68 may be determined to provide a high etch selectivity with respect to other layers such as the etch stop layer 66, the first ILD 48, and/or with respect to other subsequently formed layers. The hard mask layer 68 may be formed by a process such as CVD, ALD, or the like. However, any suitable processes and materials may be used. In some embodiments, the hard mask layer 68 has a thickness T3 between about 10 nm and about 50 nm, though other thicknesses are possible.

Figure 5:
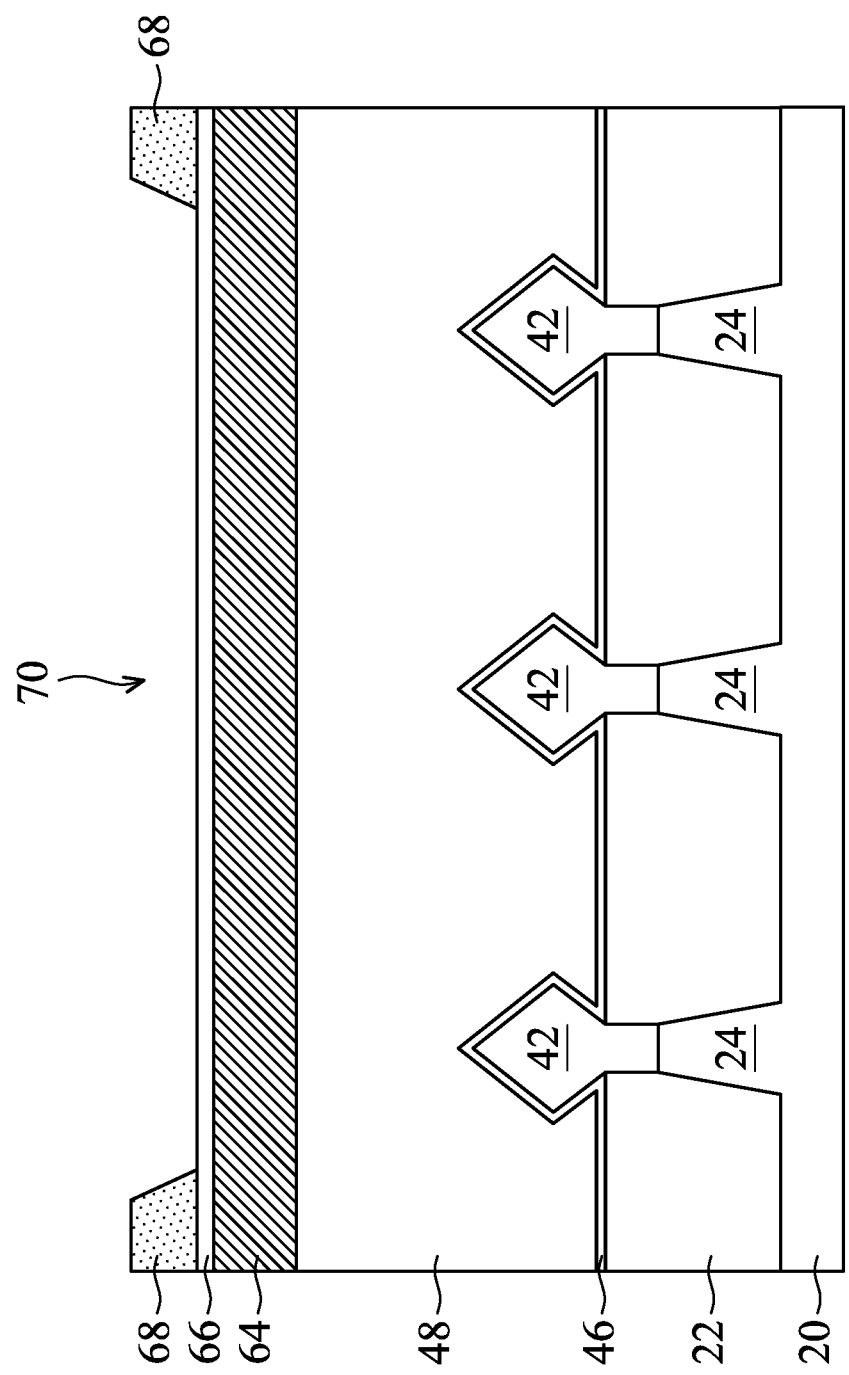

In FIG. 5, openings 70 are formed in the hard mask layer 68, in accordance with some embodiments. The openings 70 may define larger regions of the wafer 10 within which source/drain contacts 112 (see FIG. 17) may be formed. In this manner, the openings 70 may extend in the X-X direction and/or the Y-Y direction over multiple epitaxial source/drain regions 42. For example, the opening 70 shown in FIG. 5 extends over three epitaxial source/drain regions 42 in the Y-Y direction, but in other embodiments an opening 70 may extend over one, two, or more than three epitaxial source/drain regions 42.

The openings 70 in the hard mask layer 68 may be formed using suitable photolithographic techniques. For example, a photoresist (e.g., a tri-layer photoresist or the like) may be formed over the hard mask layer 68 and patterned. The hard mask layer 68 may then be etched using the patterned photoresist as an etching mask. The hard mask layer 68 may be etched using an anisotropic etching process that selectively etches the hard mask layer 68 over the etch stop layer 66. The etching process may be, for example, a suitable dry etching process. In this manner, regions of the etch stop layer 66 are exposed by the openings 70. After forming the openings 70, remaining portions or layers of the photoresist may then be removed using e.g., an ashing process or other suitable process.

Figure 6:
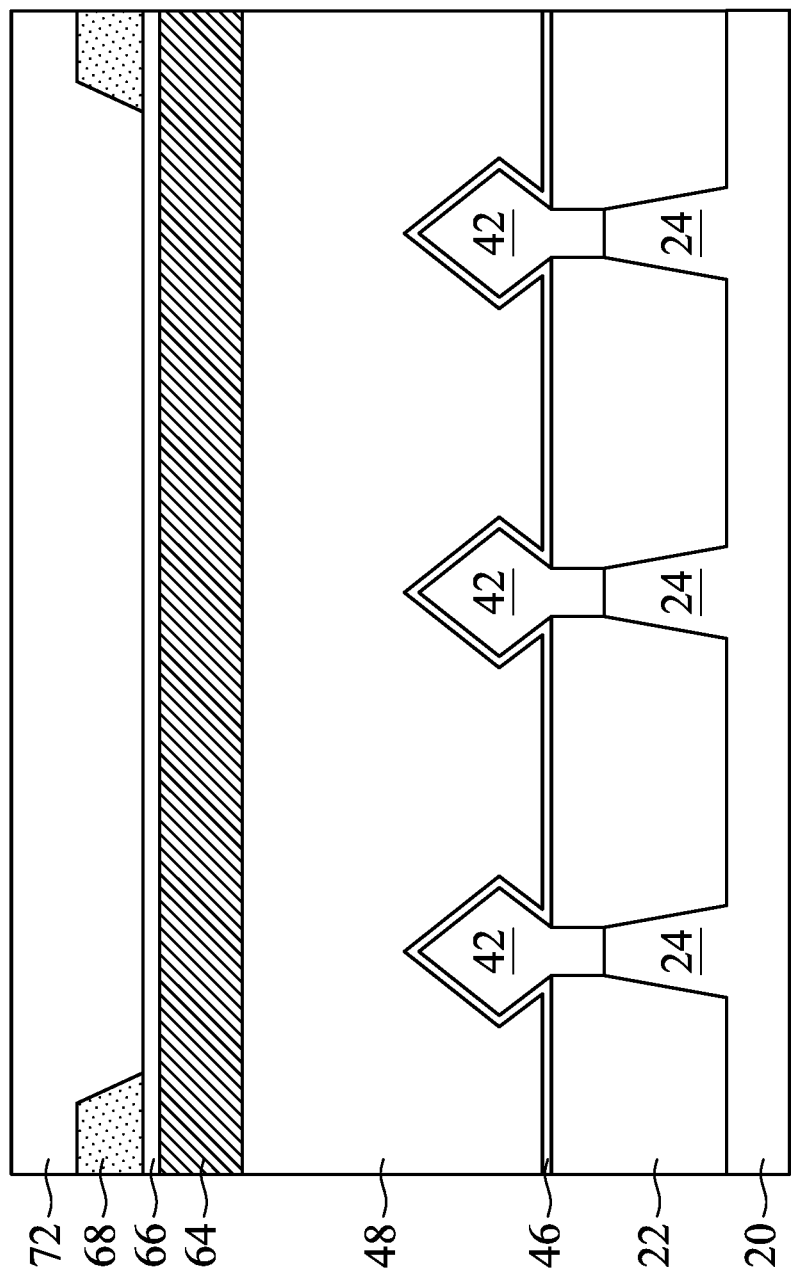

In FIG. 6, a fill material 72 is formed over the structure to fill the openings 70, in accordance with some embodiments. The fill material 72 may comprise one or more layers of dielectric material. For example, the fill material 72 may comprise an oxide such as silicon oxide, titanium oxide, tantalum oxide, aluminum oxide, another metal oxide, or the like; a nitride such as silicon nitride, silicon oxynitride, a metal nitride, or the like; or a combination thereof. The fill material 72 may be formed by a suitable process such as CVD, flowable CVD (FCVD), PECVD, ALD, PVD, a spin-on process, the like, or a combination thereof. These or other dielectric materials may be formed by any acceptable process. The fill material 72 may be a material different from the hard mask layer 68 such that the fill material 72 may be selectively etched from the hard mask layer 68. In some embodiments, the fill material 72 is a silicon oxide formed using FCVD or is a low temperature oxide (e.g., an oxide deposited using a process temperature of 200° C. or less). In some cases, an anneal may be performed on the fill material 72 after deposition. Other materials may be used.

Figure 7:
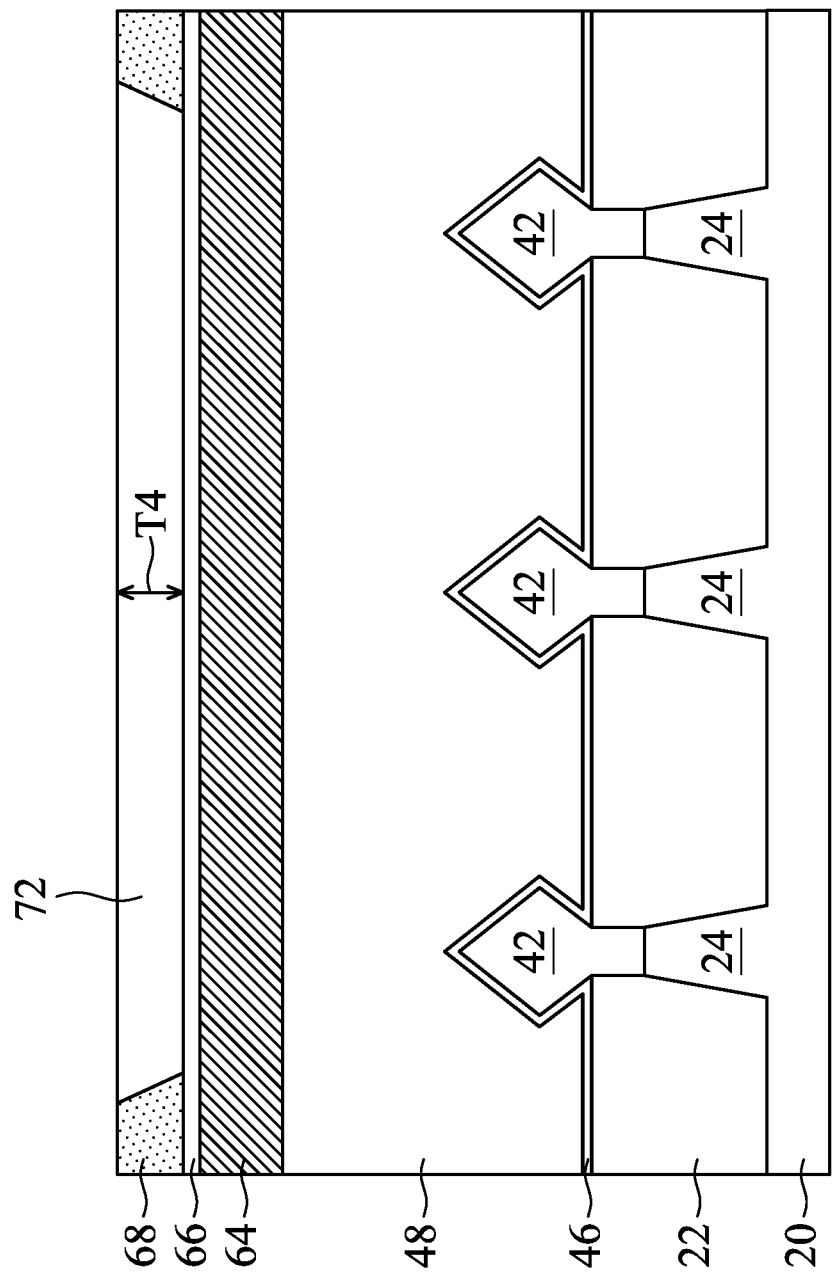

In FIG. 7, excess fill material 72 is removed using a planarization process, in accordance with some embodiments. The planarization process removes fill material 72 from over the hard mask layer 68, and may thin the hard mask layer 68. After the planarization process, the remaining fill material 72 may have a substantially flat surface, which may be about level with the hard mask layer 68. In some cases, a substantially planar surface can allow for the improved formation of smaller features using subsequent photolithographic processes, such as formation of cut mask 90 described below for FIGS. 8-11. The planarization process may include a CMP, a grinding process, or the like. After planarization, the remaining fill material 72 may have a thickness T4 that is between about 10 nm and about 50 nm, though other thicknesses are possible. In some embodiments, the thickness T4 may be about the same as the thickness T3 of the hard mask layer 68. In some embodiments, after planarization, the combined top surfaces of the hard mask layer 68 and the fill material 72 may have a height variation that is less than about 50 nm.

Figure 8:
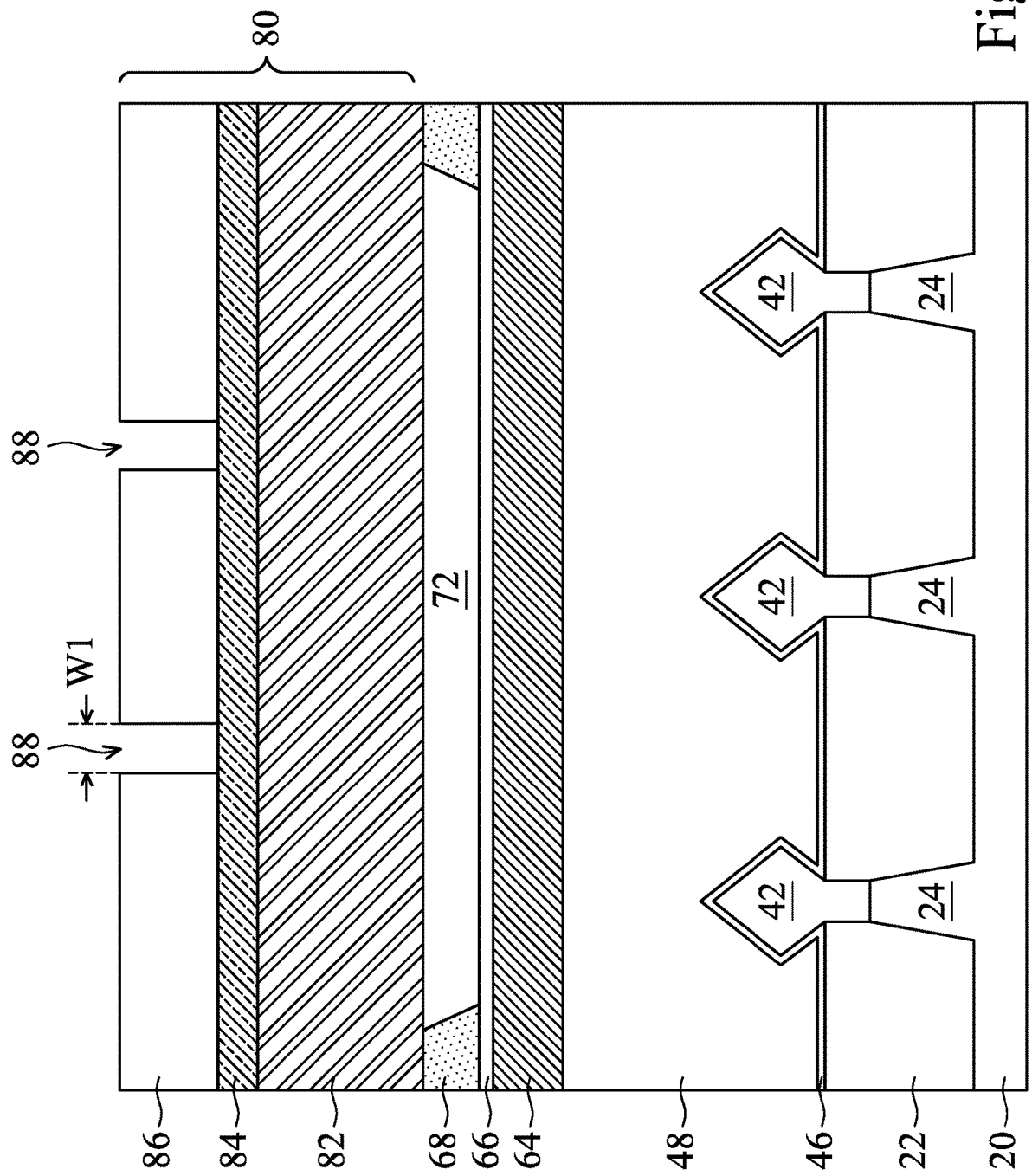

In FIG. 8, a photoresist structure 80 is formed over the hard mask layer 68 and the fill material 72 and patterned, in accordance with some embodiments. The photoresist structure 80 is used to pattern the fill material 72 described for FIG. 9. The photoresist structure 80 may be a tri-layer photoresist as shown in FIG. 8, or may have another number of layers. In some cases, using a tri-layer photoresist structure 80 can allow for improved definition of fine-pitched patterns in the fill material 72. For example, the photoresist structure 80 shown in FIG. 8 is a tri-layer photoresist that includes a bottom layer 82, a middle layer 84 over the bottom layer 82, and an upper layer 86 over the middle layer 84. The upper layer 86 may be formed of a photoresist (e.g., a photosensitive material), which includes organic materials, and may be a positive photosensitive material or a negative photosensitive material. In some embodiments, the bottom layer 82 is formed of a polymer material, and may be a bottom anti-reflective coating (BARC) layer. The middle layer 84 may comprise an inorganic material, which may be a nitride (e.g., silicon nitride), an oxynitride (e.g., silicon oxynitride), an oxide (e.g., silicon oxide), the like, or combinations thereof. The middle layer 84 may have a high etching selectivity relative to the upper layer 86 and/or the bottom layer 82. The various layers of photoresist structure 80 may be blanket deposited sequentially using, for example, spin-on processes and/or suitable deposition processes. Although a tri-layer photoresist structure 80 is discussed herein, in other embodiments, the photoresist structure 80 may be a monolayer structure or a bilayer structure (e.g., including only the bottom layer 82 and the upper layer 86 without the middle layer 84). The type of structure used (e.g., monolayer, bilayer, or tri-layer) may depend on the photolithography process used. For example, in extreme ultraviolet (EUV) lithography processes, a monolayer or bilayer may be used. The photoresist structure 80 described for FIG. 8 is an example, and photoresist structures comprising other layers, materials, or combinations thereof are possible.

As shown in FIG. 8, the photoresist structure 80 may be patterned using a suitable photolithographic process. In some embodiments, the patterning includes the formation of openings 88 in the photoresist structure 80 that correspond to regions where the cut mask 90 (see FIG. 11) is subsequently formed. In some embodiments, the openings 88 are laterally located (e.g., in a direction along Y-Y) between adjacent epitaxial source/drain regions 42. In some embodiments, the openings 88 may be formed having a width W1 in a Y-Y direction that is about 8 nm or larger, though other widths may be possible. In some embodiments, the openings 88 may be formed having a width in a X-X direction that is about 8 nm or larger, though other widths may be possible. The openings 88 may have a rectangular shape, a circular shape, an irregular shape, or another shape.

Subsequently, the upper layer 86 may be used as an etching mask for patterning of the middle layer 84 using an etching process (not separately shown in the figures). The etching process may be anisotropic, so that the openings 88 in the upper layer 86 are extended through the middle layer 84. The middle layer 84 is then used as an etching mask for patterning of the bottom layer 82 using an etching process (not separately shown in the figures). The etching process may be anisotropic, so that the openings 88 in the middle layer 84 are extended through the bottom layer 82. As part of etching the bottom layer 82, the upper layer 86 may be consumed.

Figure 9:
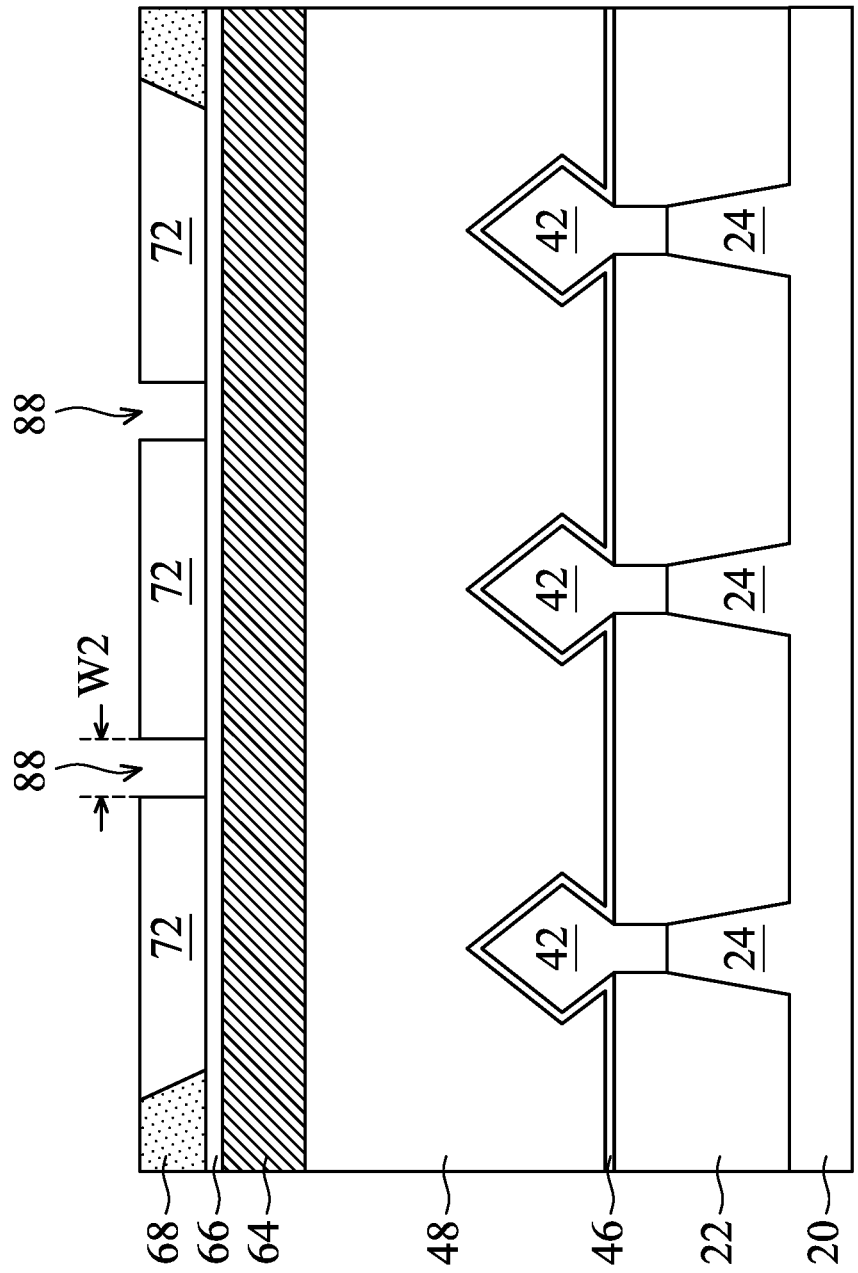

In FIG. 9, the openings 88 formed in the photoresist structure 80 are extended through the fill material 72 using an etching process, in accordance with some embodiments. The etching process may be anisotropic, so that the openings 88 in the bottom layer 82 are extended through the fill material 72 and have about the same sizes (or are slightly smaller) in the fill material 72 as they do in the photoresist structure 80. For example, the openings 88 in the fill material 72 may be formed having a width W2 in a Y-Y direction that is about 8 nm or larger, though other widths may be possible. The openings 88 in the fill material 72 may expose the etch stop layer 66. In some embodiments, an opening 88 in the fill material 72 may have an aspect ratio (width/height) between about 0.01 and about 5, though other aspect ratios are possible. In some cases, having a relatively small aspect ratio can allow the formation of openings 88 having a smaller width or finer pitch, and also can reduce stress once the openings are filled with cut mask material 90' (see FIG. 10). In some embodiments, the openings 88 may have a pitch of about 10 nm or larger, though other pitches may be possible.

In some embodiments, the etching process may include a dry etching process followed by a clean process. The etching process may have a high etching selectivity of the fill material 72 relative to the etch stop layer 66. In some embodiments, the dry etching process may include an anisotropic plasma etch having a plasma generated with a power between about 5 Watts and about 2000 Watts, and may be performed at a pressure between about 5 mTorr and about 200 mTorr. Other process conditions are possible. In some embodiments, the dry etching process may use one or more process gases such as $CF_4$, $CH_2F_2$, $CHF_3$, $NF_3$, $SF_6$, $C_4F_6$, $C_4F_8$, other fluorine-based gases, the like, or other types of process gases. In some embodiments, the clean process may include the use of SC-1, ozonated DI water ($DIO_3$), an acid-free photoresist stripper, an ashing process, or the like. Other etching techniques or clean processes may be used in other embodiments. During the etching of the fill material 72, the middle layer 84 may be consumed, and the bottom layer 82 may be at least partially consumed. In embodiments when the bottom layer 82 is not completely consumed while etching the fill material 72, an ashing process may be performed to remove remaining residue of the bottom layer 82. The remaining structure is shown in the cross-sectional view of FIG. 9.

Figure 10:
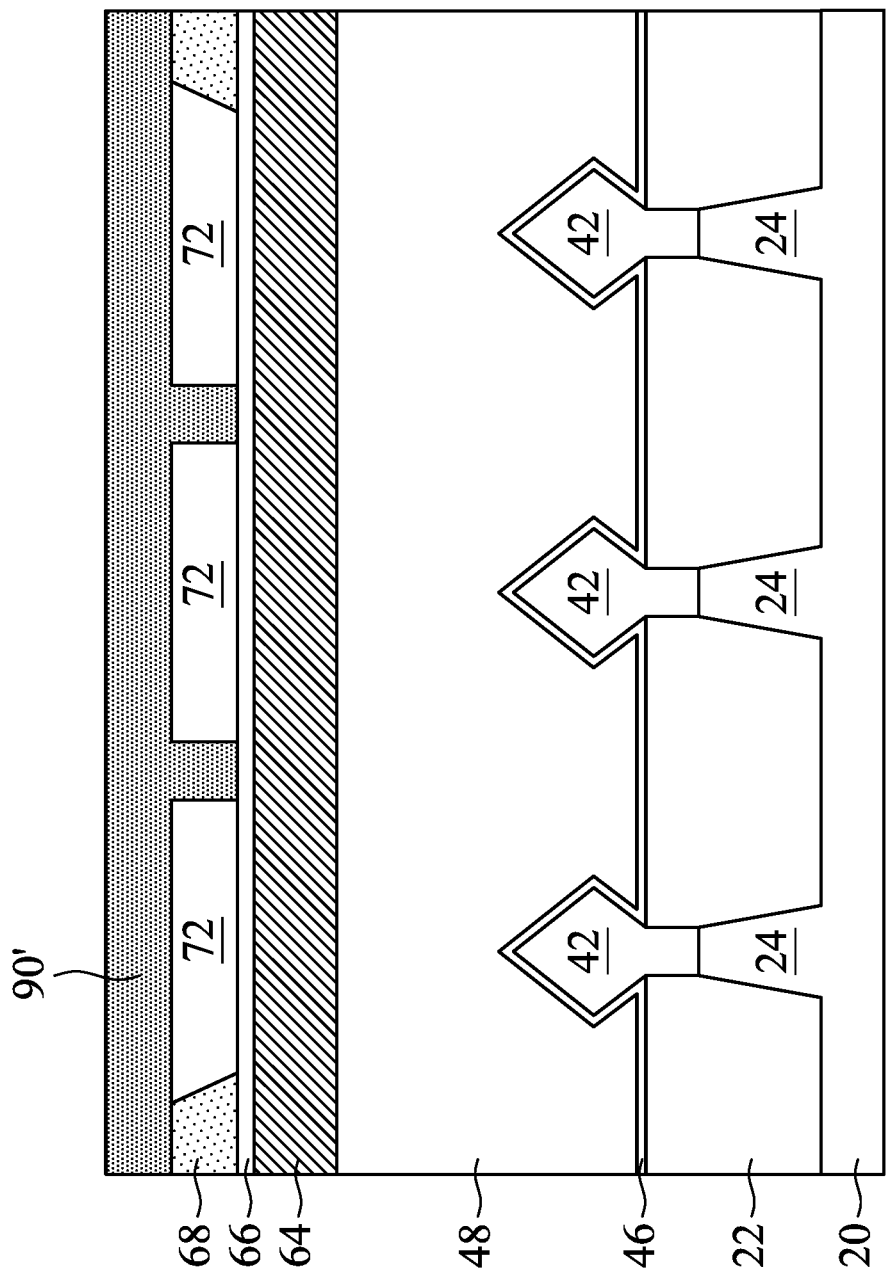

Turning to FIG. 10, a cut mask material 90' may be formed over the patterned hard mask layer 68, over the patterned fill material 72, and within the openings 88 in the patterned fill material 72. In some embodiments, the cut mask material 90' may be formed of a material that includes a metal (e.g., titanium nitride (TiN), titanium, tantalum nitride, tantalum, a metal-doped carbide (e.g., tungsten carbide (WC)), or the like) and/or a metalloid (e.g., silicon nitride, boron nitride, silicon carbide, or the like). In some embodiments, a material composition of the cut mask material 90' may be determined to provide a high etch selectivity with respect to other layers such as the etch stop layer 66, the first ILD 48, and/or with respect to other subsequently formed layers. The cut mask material 90' may be formed by a process such as CVD, ALD, or the like. However, any suitable processes and materials may be used. In some embodiments, the cut mask material 90' is the same material as the fill material 72, and may be formed in a similar manner.

Figure 11:
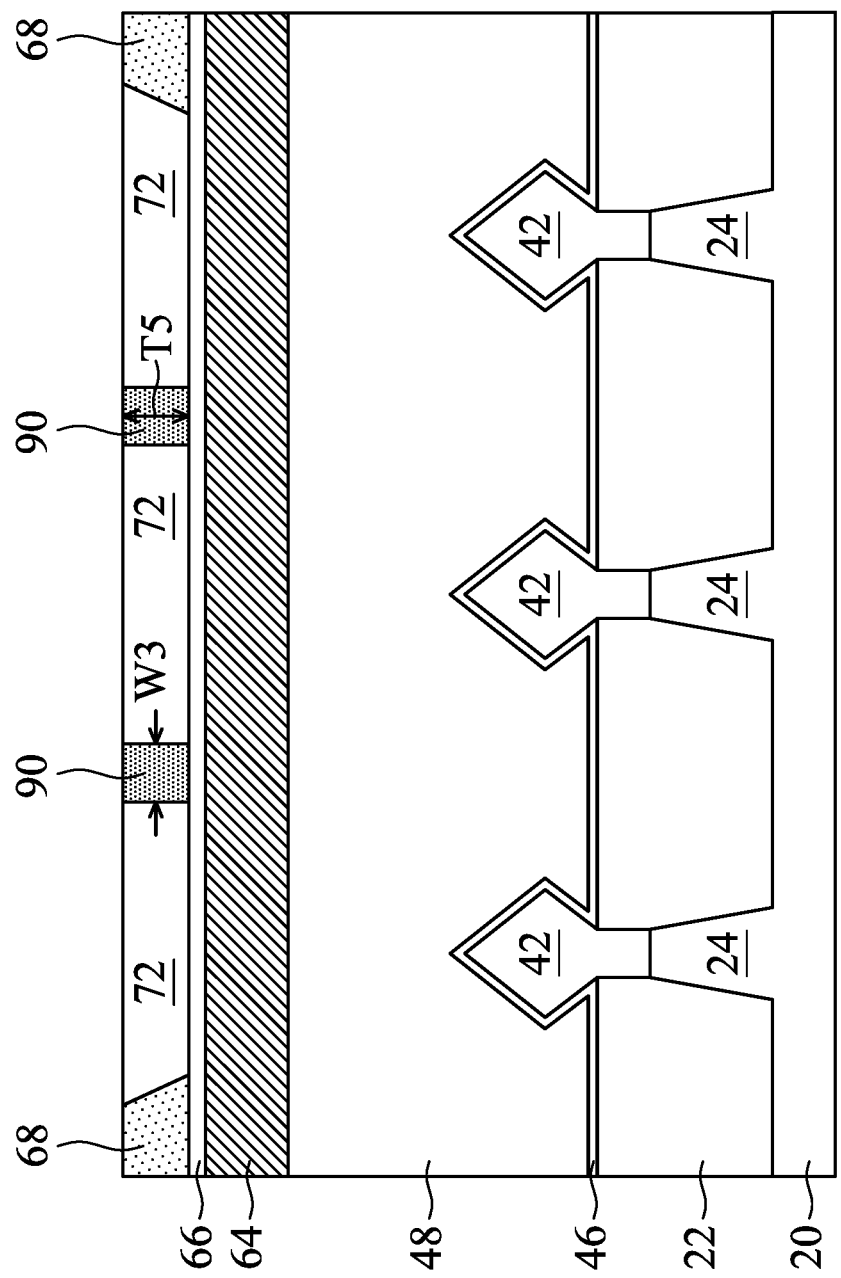

In FIG. 11, excess cut mask material 90' is removed using a planarization process to form the cut mask 90, in accordance with some embodiments. The planarization process removes cut mask material 90' from over the hard mask layer 68 and the fill material 72, and may thin the hard mask layer 68 or the fill material 72. The planarization process may include a CMP, a grinding process, or the like. The remaining portions of the cut mask material 90' form the cut mask 90. After planarization, the cut mask 90 may have a thickness T5 that is between about 5 nm and about 50 nm, though other thicknesses are possible. The thickness T5 may be about the same as the thickness T4 of the fill material 72 or the thickness T3 of the hard mask layer 68, in some embodiments. Regions of the cut mask 90 may have a width W3 in a Y-Y direction that is about 8 nm or larger, though other widths may be possible. In some cases the use of a patterned fill material 72 as described herein can allow for regions of the cut mask 90 to be formed having a smaller width (e.g., W3). The cut mask 90 may define where cuts are located between the subsequently formed source/drain contacts 112 (see FIG. 17).

Figure 12:
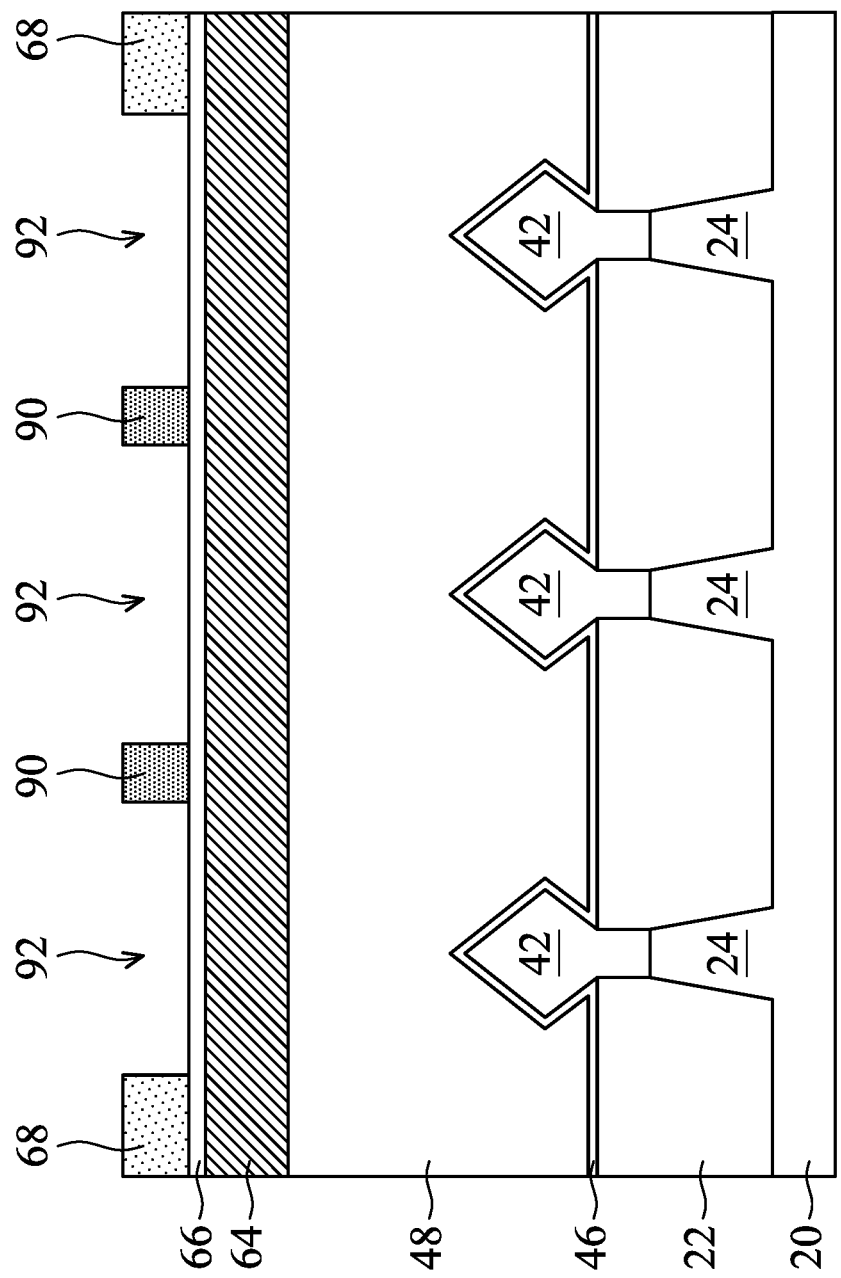
Figure 13:
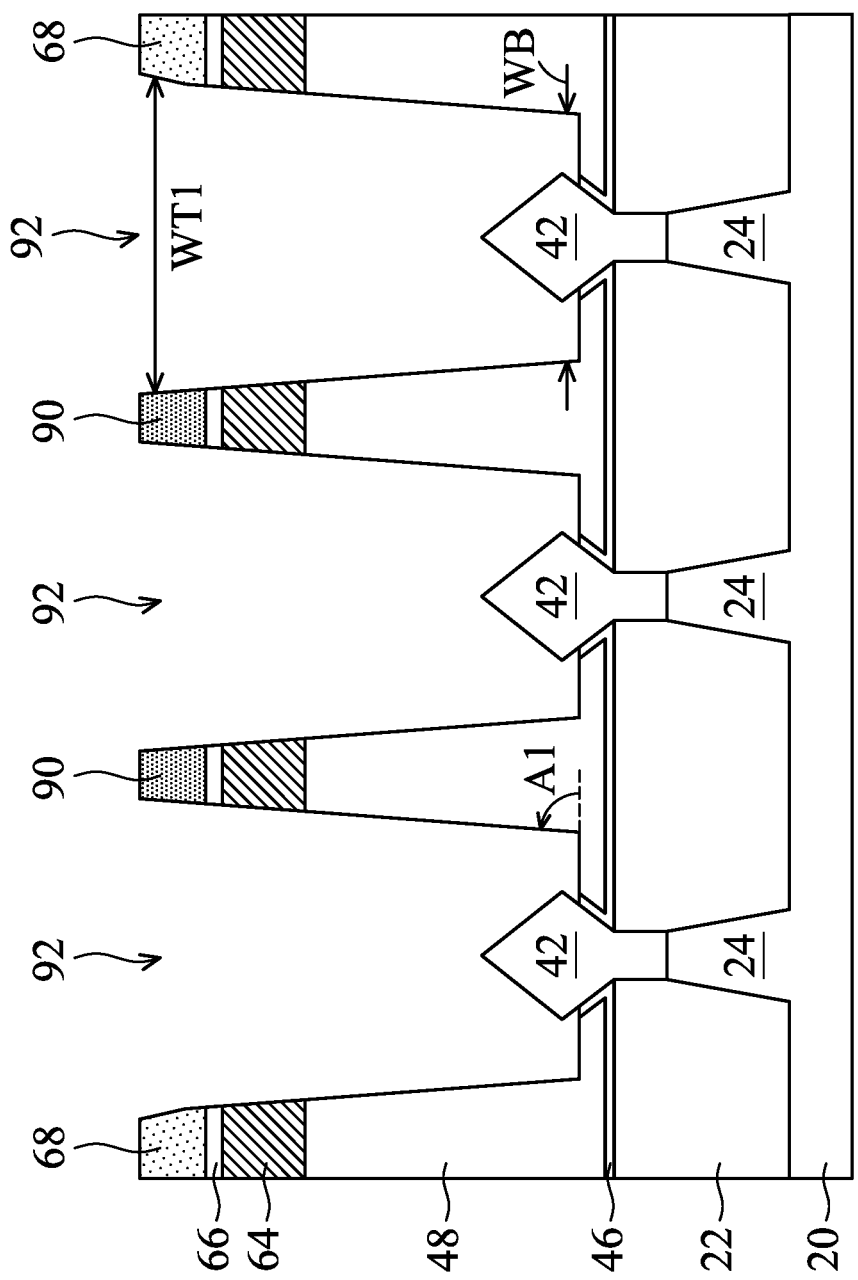

FIGS. 12 and 13 illustrate the formation of contact openings 92 using the patterned hard mask layer 68 and the cut mask 90 as a combined etching mask, in accordance with some embodiments. FIG. 12 illustrates the etching of the fill material 72 to form initial contact openings 92 that expose the etch stop layer 66. The fill material 72 may be removed by the etching, and thus the fill material 72 may be considered a "sacrificial material." FIG. 13 illustrates the etching of the etch stop layer 66, the second ILD 64, the first ILD 48, and the CESL 46 to extend the contact openings 92 into the first ILD 48 to expose the epitaxial source drain regions 42. As shown in FIGS. 12-13, the cut mask 90 defines the some regions of the first ILD 48 that separate adjacent contact openings 92, and thus forms "cuts" in the subsequently formed source/drain contacts 112 (see FIG. 17). In some cases, the use of the cut mask 90 as described herein can allow for cuts having a smaller cut width W4 (see FIGS. 15, 17A, and 17C) and thus can allow for a smaller separation between source/drain contacts 112 without increased risk of bridging or shorting. The techniques described herein can also allow for wider source/drain contacts 112, which can improve contact resistance and reduce the effects of process variation. In this manner, the density, pitch, yield, and electrical performance of a device can be improved.

Although embodiments are illustrated with regards to the etching of the fill material 72 in a single etching step and the etching of the etch stop layer 66, the second ILD 64, the first ILD 48, and the CESL 46 together in a separate single etching step, these embodiments are not intended to be limiting. For example, the fill material 72 and one or more underlying layers may be etched in a single step, or other combinations of layers may be etched using more etching steps, fewer etching steps, or other combinations of etching steps. All such embodiments are considered to be within the intended scope of this disclosure.

The contact openings 92 shown in FIGS. 12 and 13 may be etched using one or more dry etching processes and may be followed by a wet clean process, in accordance with some embodiments. The etching processes may have a high etching selectivity of the etch stop layer 66, the second ILD 64, the first ILD 48, and/or the CESL 46 relative to the hard mask layer 58 and the cut mask 90. In some embodiments, the dry etching processes may include an anisotropic plasma etch having a plasma generated with a power between about 20 Watts and about 2000 Watts, and may be performed at a pressure between about 5 mTorr and about 200 mTorr. Other process conditions are possible. In some embodiments, the dry etching processes may use one or more process gases such as $CF_4$, $CH_2F_2$, $CHF_3$, $C_4F_6$, $C_4F_8$, $NF_3$, $O_2$, Ar, $CH_3F$, He, CO, $CO_2$, COS, other fluorine-based gases, the like, or other types of process gases. In some embodiments, the wet clean process may include the use of dHF, SC-1, SPM, HPM (SC-2), $DIO_3$, the like, or other chemicals. Other etching techniques or clean processes may be used in other embodiments.

In some embodiments, the contact openings 92 are formed having a width WB near the bottom of the contact openings 92 that is larger than the width of the corresponding epitaxial source/drain regions 42, as shown in FIG. 13. In this manner, the contact area of the source/drain contact 112 (see FIG. 17) and the epitaxial source/drain region 42 can be increased, which can reduce contact resistance. Additionally, a larger bottom width WB of the contact openings 92 can reduce the effect of process variations on the contact resistance of the source/drain contacts 112. In this manner, the source/drain contacts 112 may be "self-aligned." The width of the contact openings 92 may be controlled by controlling the pattern of the etching mask formed by the patterned hard mask layer 68 and the cut mask 90.

In some embodiments, the techniques described herein can form contact openings 92 having a bottom width (e.g., bottom width WB) that is about the same or smaller than a top width (e.g., top width WT1). For example, in some embodiments, the contact openings may be formed with sidewalls having an angle A1 that is between about 83° and about 91°, though other angles are possible. By having a nearly vertical profile or a profile that tapers near the bottom, the contact openings 92 may be filled with the conductive material of the source/drain contacts 112 more efficiently, with reduced chance of voids, incomplete filling, cracking, strain, warping, or other issues that can negatively affect device performance.

Figure 14:
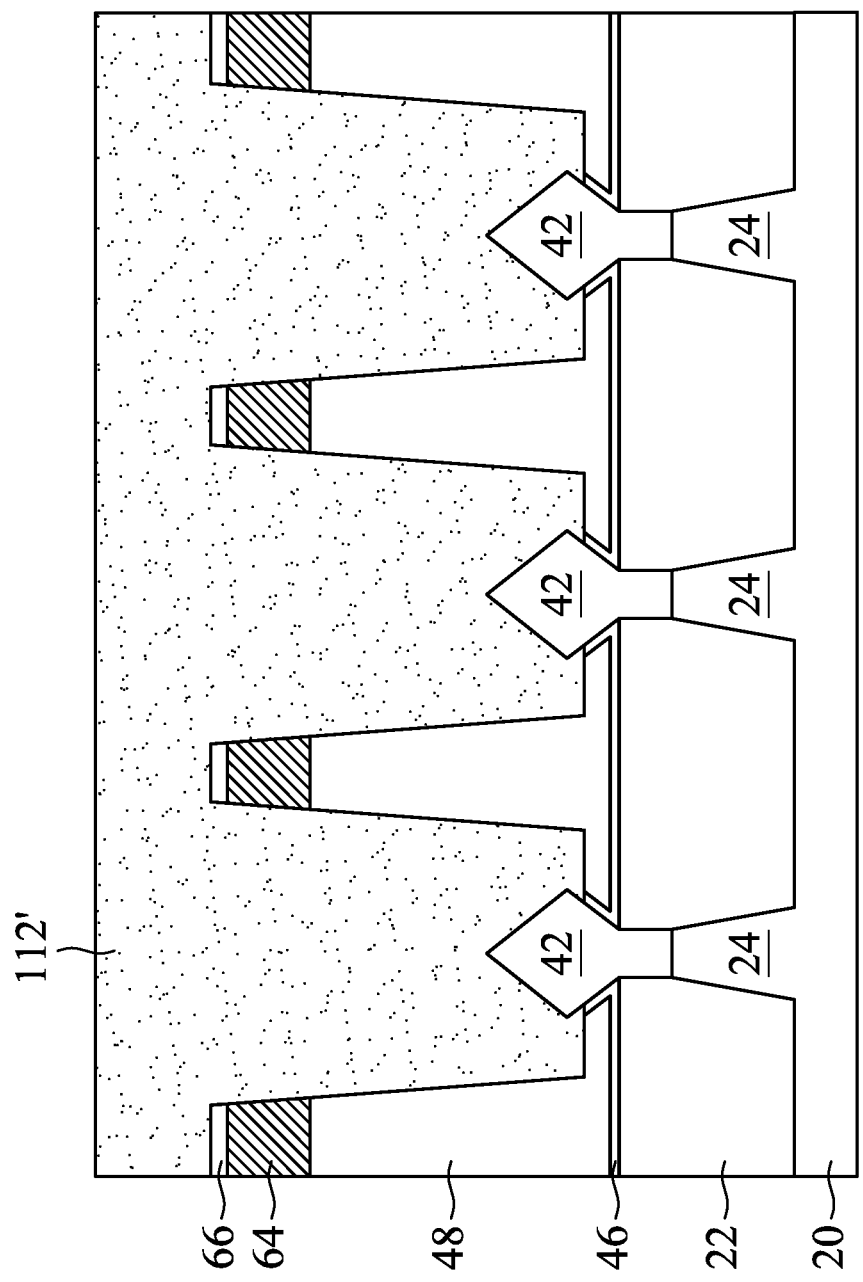
Figure 15:
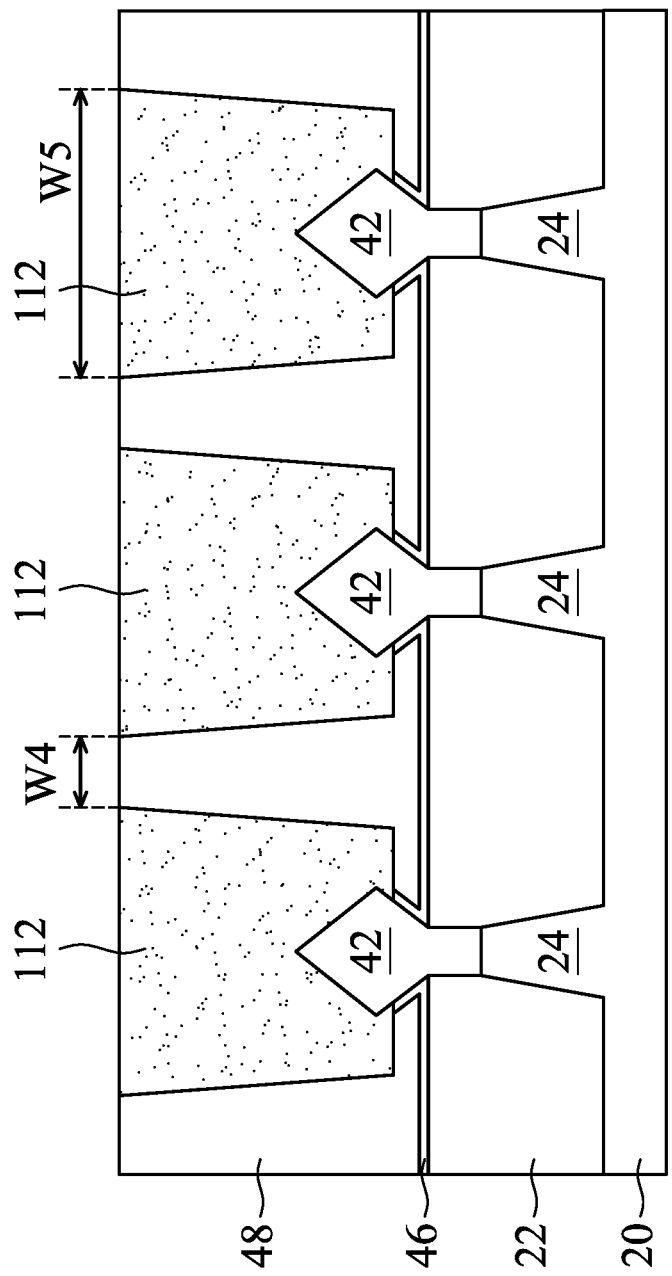

In FIGS. 14 and 15, source/drain contacts 112 are formed, in accordance with some embodiments. Referring to FIG. 14, the hard mask layer 68 and the cut mask 90 may be removed. The hard mask layer 68 and the cut mask 90 may be removed using, for example, a wet etching process using dHF, SC-1, SPM, HPM (SC-2), $DIO_3$, the like, or other chemicals. Other removal techniques are possible. A liner (not shown in the Figures) and a conductive material are formed over the etch stop layer 66 and within the openings 92, in accordance with some embodiments. In FIG. 14, the liner and the conductive material are collectively labeled as contact material 112'. The liner may be, for example, a diffusion barrier layer, an adhesion layer, or the like, and may comprise a material such as titanium, titanium nitride, tantalum, tantalum nitride, or the like. The conductive material may include, for example, copper, a copper alloy, silver, gold, tungsten, cobalt, aluminum, nickel, the like, or combinations thereof. The liner or the conductive material may be formed using a suitable process, such as ALD, CVD, PVD, plating, the like, or a combination thereof. In some embodiments, a silicide (not shown in the Figures) may be formed at the interface between the epitaxial source/drain regions 42 and the contact material 112'.

In FIG. 15, a planarization process, such as a CMP, is performed, in accordance with some embodiments. In some embodiments, the planarization removes the etch stop layer 66, the second ILD 64, and upper portions of the contact material 112'. The remaining liner and conductive material form the source/drain contacts 112. The planarization process may also thin the first ILD 48, in some embodiments. After the planarization process, the top surfaces of the source/drain contacts 112 may be substantially level with the top surfaces of the first ILD 48. As shown in FIG. 15, the source/drain contacts may be separated by a cut width W4 in a Y-Y direction that is between about 8 nm and about 15 nm, though other widths are possible. In some cases, forming a cut mask 90 as described herein can allow for a smaller cut width W4 without an increased risk of bridging or shorting. This can also allow for the source/drain contacts 112 to have a larger width W5, which can improve contact resistance and reduce sensitivity to process variations. In some embodiments, the source/drain contacts 112 may have a width W5 in a Y-Y direction that is about 10 nm or larger, though other widths may be possible.

Turning to FIGS. 16A-C and 17A-C, various views are shown of intermediate steps in the formation of source/drain contacts 112, in accordance with some embodiments. The structure shown in FIGS. 16A-C and 17A-C is similar to the structure shown in FIGS. 1-15, except for the arrangement and size of the epitaxial source/drain regions 42, the cut mask 9o, the contact openings 92, and the source/drain contacts 112. In particular, the structure shown in FIGS. 16A-C is similar to the structure shown in FIG. 13 and the structure shown in FIGS. 17A-C is similar to the structure shown in FIG. 15. As such, the structures shown in FIGS. 16A-C and FIGS. 17A-C may be formed in a similar manner as the structures shown in FIGS. 1-15. FIGS. 16A and 17A show a plan view, FIGS. 16B and 17B show a cross-sectional view along the indicated cross-section X-X, and FIGS. 16C and 17C show a cross-sectional view along the indicated cross-section Y-Y.

FIGS. 16A-C show the structure after formation of the contact openings 92, similar to FIG. 13. Specific contact openings 92A and 92B of the contact openings 92 are indicated for illustrative purposes. As shown in FIGS. 16A-C, portions of the cut mask 90 extend between epitaxial source/drain regions 42 and allow the formation of separated contact openings 92. For example, along cross-section Y-Y, cut mask 90A is used to form a separation between contact opening 92A and contact opening 92B. Contact opening 92A exposes epitaxial source/drain region 42A, and contact opening 92B exposes epitaxial source/drain region 42B. As shown in FIGS. 16A and 16C, the epitaxial source/drain regions 42 may have different lengths along the Y-Y direction, and the contact openings 92 may be formed having different widths, accordingly. As shown in FIG. 16A, cut masks 90 may have different widths in the Y-Y direction (e.g., width W3). A single cut mask 90 may also have multiple widths or have a shape different than shown in FIG. 16A.

FIGS. 17A-C show the structure after formation of the source/drain contacts 112, similar to FIG. 15. As shown in FIGS. 17A-C, portions of the first ILD 48 form "cuts" that isolate adjacent source/drain contacts 112. For example, along cross-section Y-Y, the first ILD 48 region that was previously underlying cut mask 90A isolates the source/drain contact 112A from the source/drain contact 112B. The use of the cut mask 90 as described herein can allow for a smaller cut width W4, as described previously. In some embodiments, the source/drain contacts 112 may have a width W6 in the X-X direction that is between about 9 nm and about 18 nm, though other widths are possible.

Although not explicitly shown, a person having ordinary skill in the art will readily understand that further processing steps may be performed on the structures in FIG. 15 or FIGS. 17A-C. For example, gate contacts may be formed to contact the gate stack 60, or various Inter-Metal Dielectrics (IMD) and their corresponding metallizations may be formed over the first ILD 48.

Embodiments may achieve advantages. The techniques described can allow the formation of source/drain contacts having smaller cuts without an increased risk of bridging or shorting. In particular, using a cut mask as described herein to form the cuts can allow for smaller cuts. For example, having a fill material with a substantially planar surface can reduce topographic effects during photolithographic steps, and allow for the pattern of the cut mask to be formed having a finer pitch. Due to the relatively small thickness of the fill material, the cut mask patterns that are etched into the fill material have a low aspect ratio. This low aspect ratio can reduce the chance of the fill material warping or cracking due to stress. Additionally, the techniques described herein are suitable for forming both large-area (e.g., "group") contact openings and small-area (e.g., single trench) contact openings. The techniques described herein also can form contact openings with nearly vertical profiles or profiles that taper near the bottom, which can allow for improved filling of conductive material when forming the source/drain contacts. In this manner, the contact resistance of the source/drain contacts can be reduced, and device performance can be improved.

In some embodiments, a method includes forming a first inter-layer dielectric (ILD) layer over source and drain regions of a semiconductor structure; forming a first mask material over the first ILD layer; etching first openings in the first mask material; filling the first openings with a fill material; etching second openings in the fill material; filling the second openings with a second mask material; removing the fill material; and etching the first ILD layer using the first mask material and the second mask material as an etching mask to form openings in the first ILD layer that expose portions of the source and drain regions of the semiconductor structure. In an embodiment, the method includes forming an etch stop layer over the first ILD layer before forming the first mask material. In an embodiment, the first mask material includes tungsten carbide. In an embodiment, the second mask material includes tungsten. In an embodiment, the method includes forming a second ILD layer over the first ILD layer before forming the first mask material. In an embodiment, the fill material includes a flowable oxide. In an embodiment, the method includes planarizing the fill material before etching the second openings. In an embodiment, the planarized fill material has a thickness in the range of 10 nm to 50 nm. In an embodiment, the method includes filling the openings in the first ILD layer with a conductive material; and performing a planarizing process on the conductive material, the planarizing process exposing a top surface of the first ILD layer.

In some embodiments, a method includes depositing an inter-layer dielectric (ILD) layer over a first source/drain region and a second source/drain region; forming an etching mask over the ILD layer, comprising depositing a first mask material over the ILD layer; forming a first opening in the first mask material that extends over the first source/drain region and the second source/drain region; filling the first opening with a dielectric material; forming a second opening in the dielectric material, the second opening located between the first source/drain region and the second source/drain region; and filling the second opening with a second mask material; and etching a first contact opening in the ILD layer exposing the first source/drain region and a second contact opening in the ILD layer exposing the second source/drain region, wherein an isolating region of the ILD layer underneath the second mask material isolates the first contact opening from the second contact opening. In an embodiment, the method includes depositing an etch stop layer over the ILD layer, wherein the first opening in the first mask material exposes the etch stop layer. In an embodiment, the etching of the first contact opening and the second contact opening removes the dielectric material. In an embodiment, the isolating region of the ILD layer has a smaller width near the top of the first contact opening than near the bottom of the first contact opening. In an embodiment, a top surface of the isolating region of the ILD layer has a width in the range of 8 nm to 15 nm. In an embodiment, the isolating region of the ILD layer has a sidewall angle in the range of 83° to 91°. In an embodiment, the second opening has an aspect ratio (width/height) in the range of 0.01 to 5.

In some embodiments, a method includes forming fins protruding from a substrate, the fins extending in a first direction; forming gate stacks extending over the fins, the gate stacks extending in a second direction perpendicular to the first direction; forming source/drain regions on the fins; depositing an inter-layer dielectric (ILD) layer over the source/drain regions; forming a first patterned mask, comprising depositing a sacrificial material over the ILD layer and over the gate stacks; patterning openings in the sacrificial material, wherein each opening extends over at least two gate stacks; and depositing a mask material within the openings, the first patterned mask including the mask material; etching the ILD layer using the first patterned mask to form contact openings over the source/drain regions; and filling the plurality of contact openings with conductive material to form a plurality of source/drain contacts. In an embodiment, the method includes forming a second patterned mask over the ILD layer and over the gate stacks, the second patterned mask including a patterned opening, wherein the sacrificial material is deposited within the patterned opening. In an embodiment, a portion of the ILD layer extends in the second direction from a first source/drain contact to a second source/drain contact, wherein the portion of the ILD layer has a width in the second direction that is in the range of 8 nm to 15 nm. In an embodiment, the sacrificial material includes silicon oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first inter-layer dielectric (ILD) layer over source and drain regions of a semiconductor structure;
    forming a first mask material over the first ILD layer;
    etching a plurality of first openings in the first mask material;
    filling the first openings with a fill material;
    etching a plurality of second openings in the fill material;
    filling the plurality of second openings with a second mask material;
    removing the fill material; and
    etching the first ILD layer using the first mask material and the second mask material as an etching mask to form a plurality of openings in the first ILD layer that expose portions of the source and drain regions of the semiconductor structure.

2. The method of claim 1, further comprising forming an etch stop layer over the first ILD layer before forming the first mask material.

3. The method of claim 1, wherein the first mask material comprises tungsten carbide.

4. The method of claim 1, wherein the second mask material comprises tungsten.

5. The method of claim 1, further comprising forming a second ILD layer over the first ILD layer before forming the first mask material.

6. The method of claim 1, wherein the fill material comprises a flowable oxide.

7. The method of claim 1, further comprising planarizing the fill material before etching the plurality of second openings.

8. The method of claim 7, wherein the planarized fill material has a thickness in the range of 10 nm to 50 nm.

9. The method of claim 1, further comprising:
   filling the plurality of openings in the first ILD layer with a conductive material; and
   performing a planarizing process on the conductive material, the planarizing process exposing a top surface of the first ILD layer.

10. A method comprising:
   depositing an inter-layer dielectric (ILD) layer over a first source/drain region and a second source/drain region;
   forming an etching mask over the ILD layer, comprising:
      depositing a first mask material over the ILD layer;
      forming a first opening in the first mask material that extends over the first source/drain region and the second source/drain region;
      filling the first opening with a dielectric material;
      forming a second opening in the dielectric material, the second opening located between the first source/drain region and the second source/drain region; and
      filling the second opening with a second mask material; and
   etching a first contact opening in the ILD layer exposing the first source/drain region and a second contact opening in the ILD layer exposing the second source/drain region, wherein an isolating region of the ILD layer underneath the second mask material isolates the first contact opening from the second contact opening.

11. The method of claim 10, further comprising depositing an etch stop layer over the ILD layer, wherein the first opening in the first mask material exposes the etch stop layer.

12. The method of claim 10, wherein the etching of the first contact opening and the second contact opening removes the dielectric material.

13. The method of claim 10, wherein the isolating region of the ILD layer has a smaller width near the top of the first contact opening than near the bottom of the first contact opening.

14. The method of claim 10, wherein a top surface of the isolating region of the ILD layer has a width in the range of 8 nm to 15 nm.

15. The method of claim 10, wherein the isolating region of the ILD layer has a sidewall angle in the range of 83° to 91°.

16. The method of claim 10, wherein the second opening has an aspect ratio (width/height) in the range of 0.01 to 5.

17. A method comprising:
   forming a plurality of fins protruding from a substrate, the plurality of fins extending in a first direction;
   forming a plurality of gate stacks extending over the plurality of fins, the plurality of gate stacks extending in a second direction perpendicular to the first direction;
   forming a plurality of source/drain regions on the plurality of fins;
   depositing an inter-layer dielectric (ILD) layer over the plurality of source/drain regions;
   forming a first patterned mask, comprising:
      depositing a sacrificial material over the ILD layer and over the plurality of gate stacks;
      patterning a plurality of openings in the sacrificial material, wherein each opening of the plurality of openings extends over at least two gate stacks of the plurality of gate stacks; and
      depositing a mask material within the plurality of openings, the first patterned mask comprising the mask material;
   etching the ILD layer using the first patterned mask to form a plurality of contact openings over the plurality of source/drain regions; and
   filling the plurality of contact openings with conductive material to form a plurality of source/drain contacts.

18. The method of claim 17, further comprising forming a second patterned mask over the ILD layer and over the plurality of gate stacks, the second patterned mask comprising a patterned opening, wherein the sacrificial material is deposited within the patterned opening.

19. The method of claim 17, wherein a portion of the ILD layer extends in the second direction from a first source/drain contact of the plurality of source/drain contacts to a second source/drain contact of the plurality of source/drain contacts, wherein the portion of the ILD layer has a width in the second direction that is in a range between 8 nm and 15 nm.

20. The method of claim 17, wherein the sacrificial material comprises a silicon oxide.

* * * * *